(12) United States Patent
Park et al.

(10) Patent No.: US 11,521,552 B2
(45) Date of Patent: Dec. 6, 2022

(54) DISPLAY DEVICE

(71) Applicant: Samsung Display Co., Ltd., Yongin-si (KR)

(72) Inventors: Joon Seok Park, Yongin-si (KR); So Young Koo, Yongin-si (KR); Myoung Hwa Kim, Seoul (KR); Eok Su Kim, Seoul (KR); Tae Sang Kim, Seoul (KR); Hyung Jun Kim, Seoul (KR); Yeon Keon Moon, Hwaseong-si (KR); Geun Chul Park, Suwon-si (KR); Jun Hyung Lim, Seoul (KR); Kyung Jin Jeon, Incheon (KR); Hye Lim Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 236 days.

(21) Appl. No.: 16/846,195

(22) Filed: Apr. 10, 2020

(65) Prior Publication Data
US 2021/0020110 A1    Jan. 21, 2021

(30) Foreign Application Priority Data

Jul. 17, 2019 (KR) .................. 10-2019-0086408

(51) Int. Cl.
*H01L 29/78* (2006.01)
*G09G 3/3266* (2016.01)
(Continued)

(52) U.S. Cl.
CPC ......... *G09G 3/3266* (2013.01); *G09G 3/3233* (2013.01); *G09G 3/3291* (2013.01);
(Continued)

(58) Field of Classification Search
CPC .................................................. H01L 27/3262
See application file for complete search history.

(56) References Cited

U.S. PATENT DOCUMENTS 9,202,855 B1 * 12/2015 Jo ..................... H01L 27/1218
9,891,735 B2 * 2/2018 Bae ..................... G06F 3/0443
(Continued)

FOREIGN PATENT DOCUMENTS

JP       2019-24105 A       2/2019
KR  10-2020-0107012 A       9/2020

OTHER PUBLICATIONS

Chen, Rongsheng et al.; "Self-aligned top-gate InGaZnO thin film transistor using $SiO_2/Al_2O_3$ stack gate dielectric"; Thin Solid Films; 548; 2013; pp. 572-575.

*Primary Examiner* — Trang Q Tran
(74) *Attorney, Agent, or Firm* — Lewis Roca Rothgerber Christie LLP

(57) ABSTRACT

A display device, includes: a pixel connected to a scan line and a data line crossing the scan line, wherein the pixel includes a light emitting element, a driving transistor configured to control a driving current supplied to the light emitting element according to a data voltage received from the data line, and a first switching transistor configured to apply the data voltage of the data line to the driving transistor according to a scan signal applied to the scan line; wherein the driving transistor includes a first active layer including an oxide semiconductor and a first oxide layer on the first active layer and including an oxide semiconductor; and wherein the first switching transistor includes a second active layer on the first active layer and including the same oxide semiconductor as the first oxide layer.

19 Claims, 22 Drawing Sheets

(51) Int. Cl.
  *G09G 3/3233* (2016.01)
  *G09G 3/3291* (2016.01)
  *H01L 29/786* (2006.01)
  *H01L 29/49* (2006.01)
  *H01L 27/32* (2006.01)

(52) U.S. Cl.
  CPC ...... *H01L 27/3262* (2013.01); *H01L 27/3276* (2013.01); *H01L 29/4908* (2013.01); *H01L 29/7869* (2013.01); *H01L 29/78603* (2013.01); *G09G 2300/0426* (2013.01)

(56) References Cited

U.S. PATENT DOCUMENTS

| | | | |
|---|---|---|---|
| 2012/0327032 A1* | 12/2012 | Jeon | G06F 3/042 |
| | | | 257/E31.085 |
| 2018/0076238 A1* | 3/2018 | Lim | H01L 27/1237 |
| 2019/0165004 A1* | 5/2019 | Lou | H01L 27/124 |
| 2020/0286927 A1 | 9/2020 | Park et al. | |

* cited by examiner

DRT : 310, 330, 340, 350, 360, 370
SCT : 410, 430, 440, 450

DRT : 310, 330, 340, 350, 360, 370
SCT : 410, 430, 440, 450

DRT : 310, 330, 340, 350, 360, 370
SCT : 410, 430, 440, 450

DRT : 310, 330, 340, 350, 360, 370
SCT_1 : 410, 430_1, 440_1, 450

DRT : 310, 330, 340, 350, 360, 370
SCT_1 : 410, 430_1, 440_1, 450

GPT_2 : 510_2, 530_2, 540_2, 550_2

DISPLAY DEVICE

CROSS-REFERENCE TO RELATED APPLICATION

This application claims priority to and the benefit of Korean Patent Application No. 10-2019-0086408, filed on Jul. 17, 2019 in the Korean Intellectual Property Office, and the disclosure of which is incorporated herein by reference in its entirety.

BACKGROUND

1. Field

The present invention relates to a display device and a manufacturing method thereof, and, more particularly to a display device including a thin film transistor including an oxide layer.

2. Description of the Related Art

The importance of a display device has increased with the development of multimedia. Accordingly, various types of display devices such as an organic light emitting display (OLED) and a liquid crystal display (LCD) have been used.

A display device for displaying an image includes a display panel such as an organic light emitting display panel or a liquid crystal display panel. Among display panels, an organic light emitting display panel includes an organic light emitting element, such as a light emitting diode (LED). The light emitting diode (LED) includes an organic light emitting diode (OLED) using an organic material as a fluorescent material and an inorganic light emitting diode using an inorganic material as a fluorescent material.

Such a display device includes a display panel, a gate driving circuit, a data driving circuit, and a timing controller. The display panel includes data lines, gate lines, and pixels formed at intersections of the data lines and the gate lines. Each of the pixels receives a data voltage from the data line using a thin layer transistor as a switching element when a gate signal is supplied to the gate line. Each of the pixels emits light with a brightness (e.g., a set or predetermined brightness) according to the data voltages.

Recently, a display device capable of displaying an image at a high resolution of Ultra High Definition (UHD) has been commercially available, and a display device capable of displaying an image at a high resolution of 8K Ultra High Definition (8K UHD) has been developed. UHD refers to a resolution of 3840×2160, and 8K UHD refers to a resolution of 7680×4320.

In the case of a high-resolution display device, as the number of pixels increases, a driving current of each of the pixels may decrease. Thus, the driving voltage range of a driving transistor of each of the pixels may be reduced.

The above information disclosed in this Background section is only for enhancement of understanding of the background and therefore the information discussed in this Background section does not necessarily constitute prior art.

SUMMARY

An aspect of the present invention is to provide a display device which includes a driving transistor including an oxide layer having an oxide semiconductor and a switching transistor including an active layer having the same oxide semiconductor as the oxide layer.

However, aspects of the present invention are not restricted to the one set forth herein. The above and other aspects of the present invention will become more apparent to one of ordinary skill in the art to which the present invention pertains by referencing the detailed description of the present invention given below.

According to some example embodiments of the present disclosure, a display device comprises a pixel connected to a scan line and a data line crossing the scan line, wherein the pixel includes a light emitting element, a driving transistor controlling a driving current supplied to the light emitting element according to a data voltage received from the data line, and a first switching transistor applying the data voltage of the data line to the driving transistor according to a scan signal applied to the scan line, the driving transistor includes a first active layer including an oxide semiconductor and a first oxide layer on the first active layer and including an oxide semiconductor and the first switching transistor includes a second active layer on the first active layer and including the same oxide semiconductor as the first oxide layer.

According to some example embodiments, the oxide semiconductor of the first active layer may include at least one of indium (In), gallium (Ga), zinc (Zn), tin (Sn), or hafnium (Hf).

According to some example embodiments, the oxide semiconductor of each of the first oxide layer and the second active layer may include at least one of indium (In), gallium (Ga), zinc (Zn), tin (Sn), or hafnium (Hf).

According to some example embodiments, the driving transistor may include a first gate insulating layer on the first active layer and a first gate electrode on the first gate insulating layer and overlapping the first active layer, and the first oxide layer may be between the first gate electrode and the first gate insulating layer.

According to some example embodiments, the first active layer may include a first conducting region, a second conducting region, and a channel region between the first conducting region and the second conducting region, and at least a portion of the first oxide layer may overlap the channel region of the first active layer.

According to some example embodiments, the driving transistor may include a first source electrode contacting the first conducting region through a first contact hole penetrating an interlayer insulating layer on the first active layer, and a first drain electrode contacting the second conducting region through a second contact hole penetrating the interlayer insulating layer.

According to some example embodiments, the second active layer may be on the first gate insulating layer, the first switching transistor includes a second gate electrode under the second active layer, and a width of the second active layer may be greater than a width of the second gate electrode.

According to some example embodiments, the first switching transistor may include a second source electrode contacting one side of the second active layer and a second drain electrode contacting the other side of the second active layer.

According to some example embodiments, the first switching transistor may include a first conductive pattern contacting the second source electrode through a fourth hole penetrating an interlayer insulating layer on the second active layer, and a second conductive pattern contacting the second drain electrode through a fifth contact hole penetrating the interlayer insulating layer.

According to some example embodiments, the display device may further comprise a scan driver outputting a scan signal to the scan line, wherein the scan driver may include a second switching transistor including a third active layer containing an oxide semiconductor and a third gate electrode under the third active layer.

According to some example embodiments, the scan driver may include a third switching transistor including a fourth active layer containing an oxide semiconductor and a fourth gate electrode under the fourth active layer.

According to some example embodiments of the present disclosure, a display device comprises a substrate including a display area and a non-display area, a first conductive layer on the substrate and including light blocking layer in the display area, a buffer layer on the first conductive layer and covering the light blocking layer, a first semiconductor layer on the buffer layer and including an oxide semiconductor, the first semiconductor layer including an active layer in the display area, a gate insulating layer on the first semiconductor layer and covering the active layer, a second semiconductor layer on the gate insulating layer and including an oxide semiconductor, the second semiconductor layer including an oxide layer in the display area, a second conductive layer on the second semiconductor layer and including a gate electrode, an interlayer insulating layer on the second conductive layer and covering the gate electrode and a third conductive layer on the interlayer insulating layer and including a source electrode and a drain electrode.

According to some example embodiments, each of the first semiconductor layer and the second semiconductor layer may include at least one of indium (In), gallium (Ga), zinc (Zn), tin (Sn), or hafnium (Hf).

According to some example embodiments, the first semiconductor layer may include a first active layer on the light blocking layer, the second conductive layer may include a first gate electrode on the first active layer, and the oxide layer may include a first oxide layer between the first active layer and the first gate electrode.

According to some example embodiments, the third conductive layer may include a first source electrode contacting one side of the first active layer through a first contact hole penetrating the interlayer insulating layer to exposed one side of the first active layer, and a first drain electrode contacting the other side of the first active layer through a second contact hole penetrating the interlayer insulating layer to exposed the other side of the first active layer.

According to some example embodiments, the first source electrode may be in contact with the light blocking layer through a third contact hole penetrating the interlayer insulating layer and the buffer layer to expose a portion of the light blocking layer.

According to some example embodiments, the first conductive layer may further include a second gate electrode, and the second semiconductor layer may further include a second active layer on the second gate electrode.

According to some example embodiments, the second conductive layer may further include a second source electrode contacting one side of the second active layer and a second drain electrode contacting the other side of the second active layer.

According to some example embodiments, the third conductive layer may further include a first conductive pattern contacting the second source electrode through a fourth contact hole penetrating the interlayer insulating layer to expose a portion of the second source electrode, and a second conductive pattern contacting the second drain electrode through a fifth contact hole penetrating the interlayer insulating layer to expose a portion of the second drain electrode.

According to some example embodiments, the first conductive layer may further include a third gate electrode in the non-display area, the second semiconductor layer may further include a third active layer on the third gate electrode, and the second conductive layer may further include a third source electrode contacting one side of the third active layer and a third drain electrode contacting the other side of the third active layer.

BRIEF DESCRIPTION OF THE DRAWINGS

The above and other aspects and features of the present invention will become more apparent by describing in more detail aspects of some example embodiments thereof with reference to the attached drawings, in which.

DETAILED DESCRIPTION

The present invention will now be described more fully hereinafter with reference to the accompanying drawings, in which example embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Hereinafter, embodiments of the present invention will be described with reference to the attached drawings.

Figure 1:
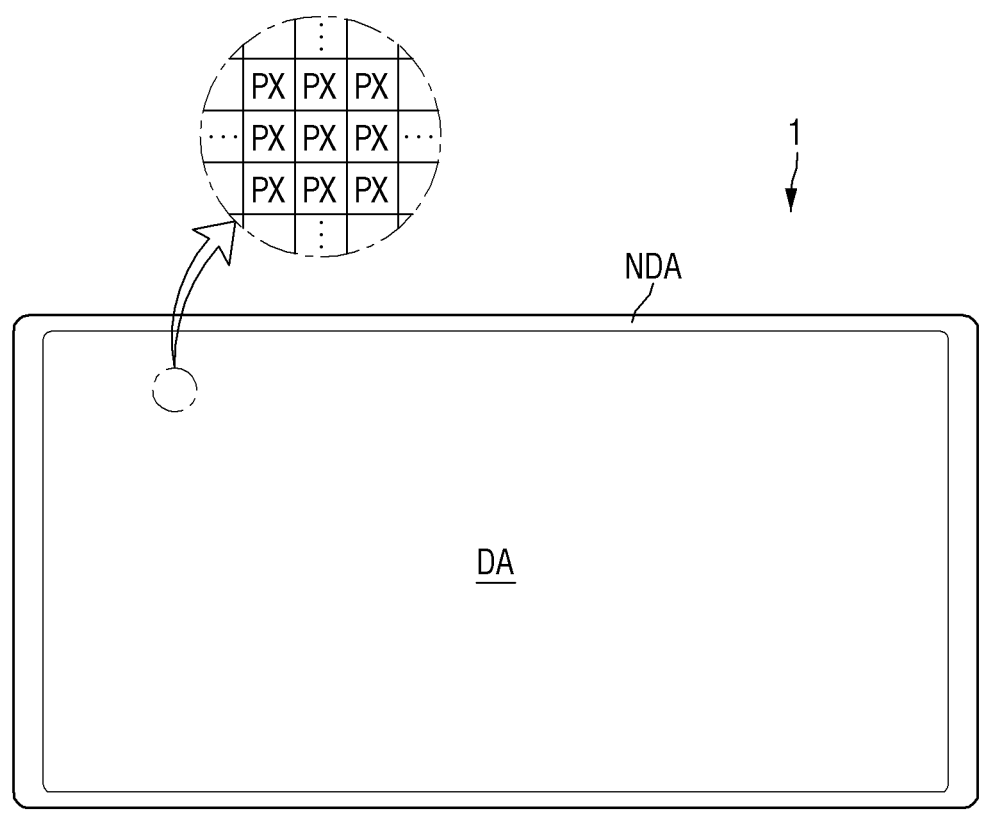
FIG. 1 is a perspective view of a display device according to some example embodiments.

FIG. 1 is a perspective view of a display device according to some example embodiments.

Referring to FIG. 1, a display device 10 displays a mobile image or a still image. The display device 1 may refer to any electronic device that provides a display screen. For example, the display device 1 may be used in televisions, notebooks, monitors, billboards, internet of things, mobile phones, smart phones, tablet personal computers (PCs), electronic watches, smart watches, watch phones, head mounted displays, mobile communication terminals, electronic notebooks, electronic books, portable multimedia players (PMPs), navigators, game machines, digital cameras, camcorder, and the like.

The display device 1 includes a display panel for providing a display screen. Examples of the display panel may include an LED display panel, an organic light emitting display panel, a quantum dot light emitting display panel, a plasma display panel, and a field emission display panel. Hereinafter, embodiments in which an LED display panel is used as the display panel are described, but embodiments according to the present invention are not limited thereto. Any suitable display panel may be used as the display panel as long as the same technical idea is applicable.

The shape of the display device 1 may be variously modified. For example, the display device 1 may have a shape such as a rectangle having longer horizontal sides, a rectangle having longer vertical sides, a square, a rectangle having round corners (vertexes), another polygon, or a circle. That is, the display device 1 may have any suitable shape according to the design and function of the display device 1. The shape of a display area DA of the display device 1 may also be similar to the overall shape of the display device 1. FIG. 1 illustrates a display device 1 and a display area DA each having a rectangular shape having longer horizontal sides.

The display device 1 may include a display area DA and a non-display area NDA. The display area DA is an area where an image is displayed, and the non-display area NDA is an area where an image is not displayed. The display area DA may be referred to as an active area, and the non-display area NDA may be referred to as an inactive area.

The display area DA may generally occupy the center of the display device 1. The display area DA may include a plurality of pixels PX. The plurality of pixels PX may be arranged in a matrix direction. Each of the pixels PX may have a rectangular shape or a square shape in a plan view, but the shape thereof is not limited thereto. Each of the pixels PX may have a rhombus shape in which each side is inclined with respect to a first direction DR1.

Figure 2:
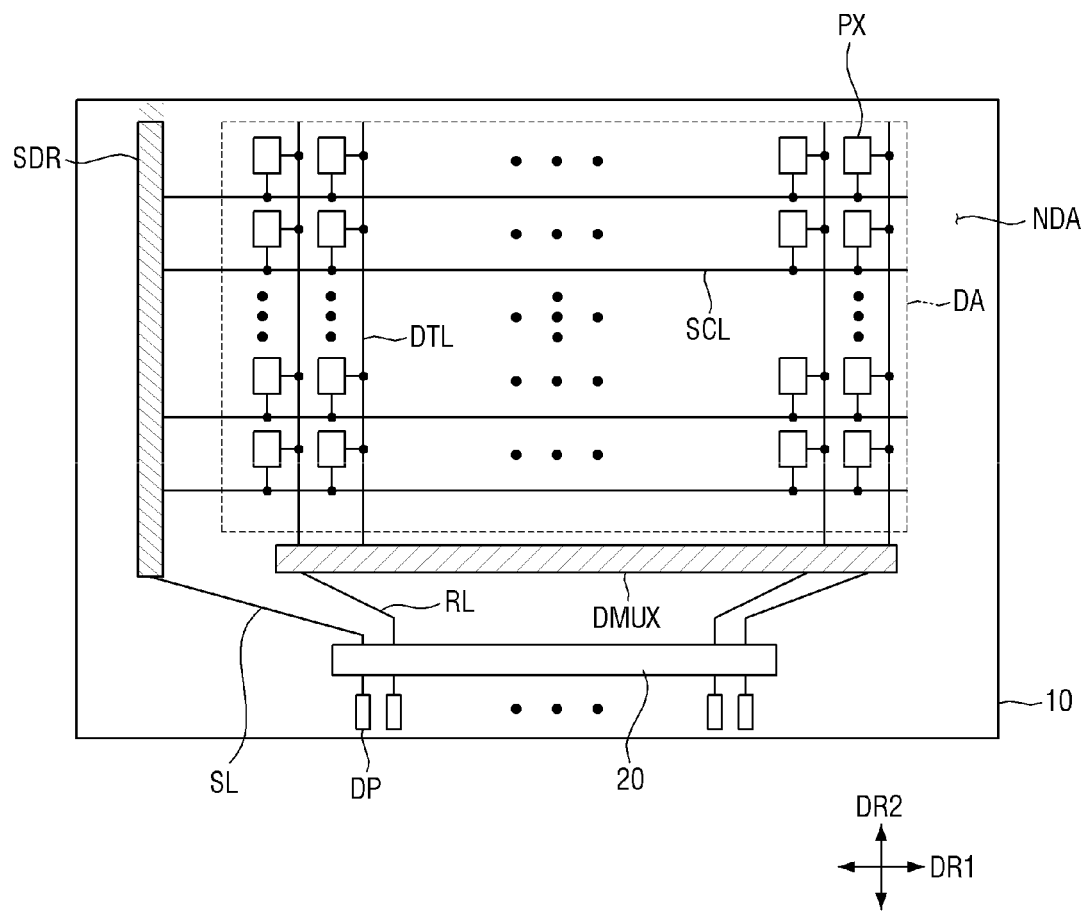
FIG. 2 is a schematic plan view of a display device according to some example embodiments.

FIG. 2 is a schematic plan view of a display device according to some example embodiments.

Referring to FIG. 2, the display device 1 includes a display panel 10, an integrated driver 20, and a scan driver SDR. The integrated driver 20 may include a timing controller and a data driver.

The display panel 10 may include a display area DA in which pixels PXs are formed to display an image, and a non-display area NDA which is a peripheral area of the display area DA. When the display panel 10 includes a curved portion, the display area DA may be located on the curved portion. In this case, the image of the display panel 10 may also be seen even on the curved portion.

The pixels PX, as well as scan lines SCL1 to SCLk (k is an integer of 2 or more), data lines DTL1 to DTLj (j is an integer of 2 or more), and power supply lines may be arranged in the display area DA. The scan lines SCL may be formed or arranged to extend in parallel with each other along a first direction DR1, and the data lines DTL may be formed or arranged to extend in parallel with each other along a second direction DR2 crossing the first direction DR1. Each of the pixels PX may be connected to at least one of the scan lines SCL and at least one of the data lines DTL.

Each of the pixels PX may include a driving transistor, at least one switching transistor, a light emitting element, and a capacitor. When a scan signal is applied to the switching transistor from the scan line SCL, the switching transistor is turned on, and thus a data voltage of the data line DTL may be applied to a gate electrode of the driving transistor. The driving transistor may emit light by supplying a driving current to the light emitting element according to the data voltage applied to the gate electrode. The driving transistor and the at least one switching transistor may be thin film transistors. The light emitting element may emit light according to the driving current of the driving transistor. The light emitting element may be an organic light emitting diode including a first electrode, an organic light emitting layer, and a second electrode. The capacitor may serve to maintain the data voltage applied to the gate electrode of the driving transistor at a constant level.

The non-display area NDA may be defined as an area from the outside of the display area DA to the edge of the display panel 10. That is, the display area DA may be located within the non-display area NDA, and the non-display area NDA may be an area outside a footprint of the display area DA. The non-display area NDA may be provided with a scan driver SDR for applying scan signals to the scan lines SCL and a data voltage distribution circuit DMUX connected between the data lines DTL and routing lines RL. Further, the non-display area NDA may be provided with pads DP electrically connected to the integrated driver 20. In this case, the integrated driver 20 and the pads DP may be located at one side edge of the display panel 10.

The integrated driver 20 is connected to the display pads DP to receive digital video data and timing signals. The integrated driver 20 converts the digital video data into analog positive/negative data voltages and supplies the analog positive/negative data voltages to the data lines DTL through the routing lines RL and the data voltage distribution circuit DMUX. Further, the integrated driver 20 generates and supplies a scan control signal for controlling the scan driver SDR through the scan control line SL. The pixels PX to which the data voltages are to be supplied are selected by the scan signals of the scan driver SDR, and the data voltages are supplied to the selected pixels XP. Further, the integrated driver 20 may supply power supply voltages to the power supply lines.

The integrated driver 20 may be formed as an integrated circuit (IC) and mounted on the display panel 10 in the pad area by a chip on glass (COG) method, a chip on plastic (COP) method, or an ultrasonic bonding method. However, embodiments according to the present invention are not limited thereto. For example, the integrated driver 20 may be mounted on a separate circuit board.

The pads DP may be electrically connected to the integrated driver 20. According to some example embodiments, the circuit board may be attached onto the pads DP using an anisotropic conductive film. Thus, lead lines of the circuit board may be electrically connected to the pads DP. The circuit board may be a flexible printed circuit board, a printed circuit board, or a flexible film such as a chip on film. The circuit board may be bent toward the lower side of the display panel 10. In this case, one side of the circuit board may be attached to one side edge of the display panel 10, and the other side thereof may be located under the display panel 10 to be connected to a system board on which a host system is mounted.

The scan driver SDR may be connected to the integrated driver 20 through at least one scan control line SL to receive a scan control signal. The scan driver SDR may generate scan signals according to the scan control signal and sequentially output the scan signals to the scan lines SCL. Although it is shown in FIG. 2 that the scan driver SDR is formed at one side of the display area DA, for example, at the left side of the non-display area NDA, embodiments according to the present invention are not limited thereto. For example, the scan drivers SDR may be formed at both sides of the display area DA, for example, at the left and right sides of the non-display area NDA.

The data voltage distribution circuit DMUX may be connected between the routing lines RL and the data lines DTL. The ratio of the number of the routing lines RL connected to the data voltage distribution circuit DMUX and the number of the data lines DTL connected to the data voltage distribution circuit DMUX may be 1:q (q is an integer of 2 or more). The data voltage distribution circuit DMUX may serve to distribute the data voltages applied to one routing line RL to the plurality of data lines DTL.

A power supply circuit may generate voltages for driving the display panel 10 from a main power source applied from the system board, and supply the generated voltages to the display panel 10. For example, the power supply circuit may generate a first power supply voltage and a second power supply voltage for driving the light emitting elements EL of the display panel 10 from the main power source, and supply the first power supply voltage and the second power supply voltage to a first voltage line VDD (shown in FIG. 3) and a second voltage line VSS (shown FIG. 3) of the display panel 10. The power supply circuit may generate and supply driving voltages for driving the integrated driver 20 and the scan driver SDR from the main power source.

The power supply circuit may be formed as an integrated circuit and mounted on a circuit board, but embodiments according to the present invention are not limited thereto. For example, the power supply circuit may be formed to be integrated with the integrated driver 20.

Figure 3:
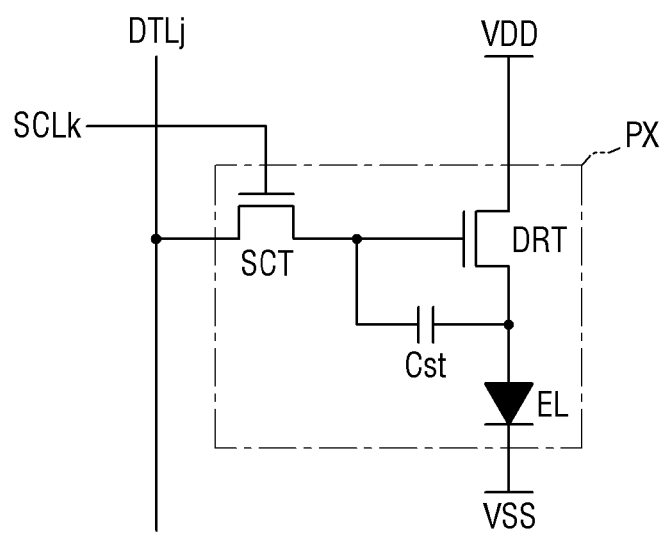
FIG. 3 is a circuit diagram of one pixel of FIG. 2.

FIG. 3 illustrates an example circuit diagram of one pixel of FIG. 2.

Referring to FIG. 3, the pixel PX may include a driving transistor DRT, a first switching transistor SCT, a light emitting element EL, and a capacitor Cst. Although it is shown in FIG. 3 that each pixel PX has a 2T1C (2Transistor-1Capacitor) structure including one driving transistor DRT, one first switching transistor SCT, and one capacitor Cst, embodiments according to the present invention are not limited thereto. Although certain components of an example pixel PX are illustrated in FIG. 3, according to some example embodiments, each pixel PX may include a larger number of transistors and a plurality of capacitors.

Each of the driving transistor DRT and the first switching transistor SCT may include a first electrode, a second electrode, and a gate electrode. One of the first electrode and the second electrode may be a source electrode, and the other thereof may be a drain electrode.

Each of the driving transistor DRT and the first switching transistor SCT may be formed as a thin film transistor. Although it is shown in FIG. 3 that each of the driving transistor DRT and the first switching transistor SCT may be formed as an N-type metal oxide semiconductor field effect transistor (MOSFET), embodiments according to the present invention are not limited thereto. Each of the driving transistor DRT and the first switching transistor SCT may also be formed as a P-type MOSFET. In this case, positions of the source electrode and the drain electrode of each of the driving transistor DRT and the first switching transistor SCT may be changed. Hereinafter, a case where the driving transistor DRT and the first switching transistor SCT are N-type MOSFETs will be described.

The driving transistor DRT may emit light by supplying a driving current to the light emitting element EL according to a data voltage applied to the gate electrode. That is, the driving transistor DRT may be a driving transistor. The gate electrode of the driving transistor DRT may be connected to the source electrode of the first switching transistor SCT, the source electrode thereof may be connected to the first electrode of the light emitting element EL, and the drain electrode thereof may be connected to the first power supply line VDD to which the first power supply voltage is applied.

When a scan signal is applied from the kth scan line SCLk (k is a positive integer), the first switching transistor SCT is turned on, and thus the data voltage of the jth data line DTLj (j is a positive integer) may be applied to the gate electrode of the driving transistor DRT. That is, the first switching transistor SCT may be a switching transistor. The gate electrode of the first switching transistor SCT may be connected to the kth scan line SCLk, the source electrode thereof may be connected to the gate electrode of the driving transistor DRT, and the drain electrode may be connected to the jth data line DTLj.

The capacitor Cst may be connected between the gate electrode and the source electrode of the driving transistor DRT. Thus, the capacitor Cst may serve to maintain a data voltage applied to the gate electrode of the driving transistor DRT constant.

The light emitting element EL may emit light according to a driving current of the driving transistor DRT. The light emitting element EL may be an organic light emitting diode including a first electrode, an organic light emitting layer, and a second electrode. The first electrode of the light emitting element EL may be connected to the source electrode of the driving transistor DRT, and the second electrode may be connected to the second power supply line VSS to which a second power voltage lower than the first power voltage is applied.

Figure 4:
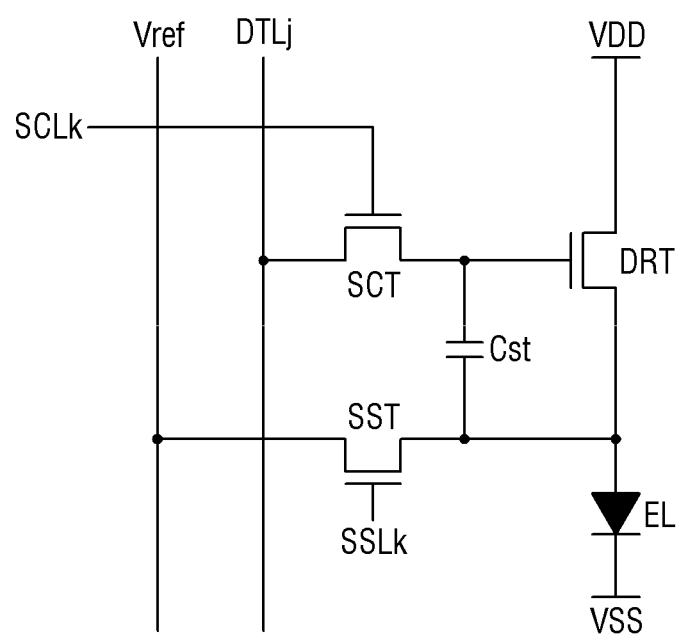
FIG. 4 is a circuit diagram of one pixel of FIG. 2.

FIG. 4 illustrates an example circuit diagram of one pixel of FIG. 2 according to some example embodiments.

Referring to FIG. 4, the pixel PX may include a driving transistor DRT, a first switching transistor SCT, a sensing transistor SST, a light emitting element EL, and a capacitor Cst. It is shown in FIG. 4 that each pixel PX has a 3T1C (3Transistor-1Capacitor) structure including one driving transistor DRT, one first switching transistor SCT, one sensing transistor SST, and one capacitor Cst. The circuit diagram of FIG. 4 is the same as the circuit diagram of FIG. 3, except that it further includes a sensing transistor SST and a reference line Vref.

The circuit diagram of FIG. 4 may further include a compensation circuit including a sensing transistor SST and a reference line Vref. The compensation circuit is a circuit additionally provided in each pixel PX to compensate for a threshold voltage of the driving transistor DRT.

The sensing transistor SST may be connected between the source electrode of the driving transistor DRT and the first electrode of the light emitting element EL. The gate electrode of the sensing transistor SST may be connected to the k-th sensing signal line SSLk, the drain electrode thereof may be connected to the reference line Vref, and the source electrode thereof may be connected to one end of the capacitor Cst. The sensing transistor SST is turned on by the sensing signal of the kth sensing signal line SSLk, and operates to supply a reference voltage, which is transmitted through the reference line Vref, to the source electrode of the driving transistor DRT or to sense the voltage or current of the source electrode of the driving transistor DRT.

The reference line Vref may be connected to the scan driver SDR. In this case, the scan driver SDR may sense the source electrode of the driving transistor DRT of each pixel PX during a real time, a non-display period of an image, or N frame (N is an integer of 1 or more) and generate a sensing result. Meanwhile, the first switching transistor SCT and the sensing transistor SST may be turned on at the same time. In this case, the sensing operation through the reference line Vref and the data output operation for outputting data signals are separated from each other according to the time division method of the scan driver SDR.

Besides, the compensation target according to the sensing result may be a digital data signal, an analog data signal, or a gamma signal. The compensation circuit for generating a compensation signal based on the sensing result may be implemented in the scan driver SDR, in the timing controller, or as a separate circuit.

However, embodiments according to the present invention are not limited thereto. FIGS. 3 and 4 illustrate a pixel PX having a 2T1C structure and a pixel PX having a 3T1C structure, but each pixel PX may include a larger number of transistors or capacitors. Some detailed description thereof may be omitted.

Hereinafter, the structure and arrangement of the transistors provided in each pixel PX will be described.

Figure 5:
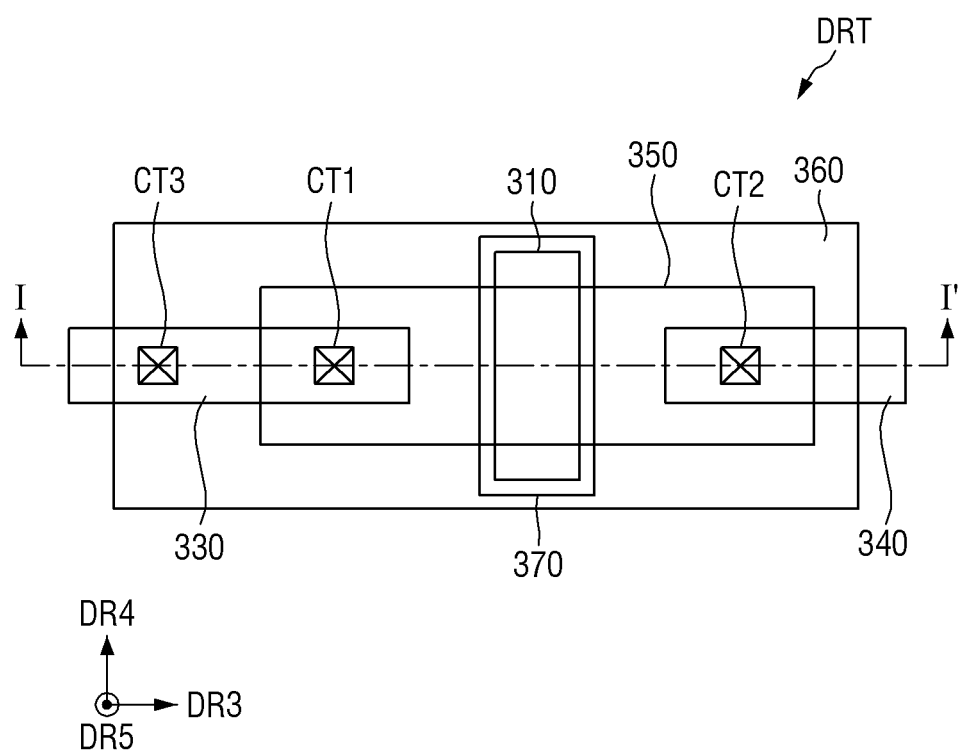
FIG. 5 is a plan view of a driving transistor according to some example embodiments.
Figure 6:
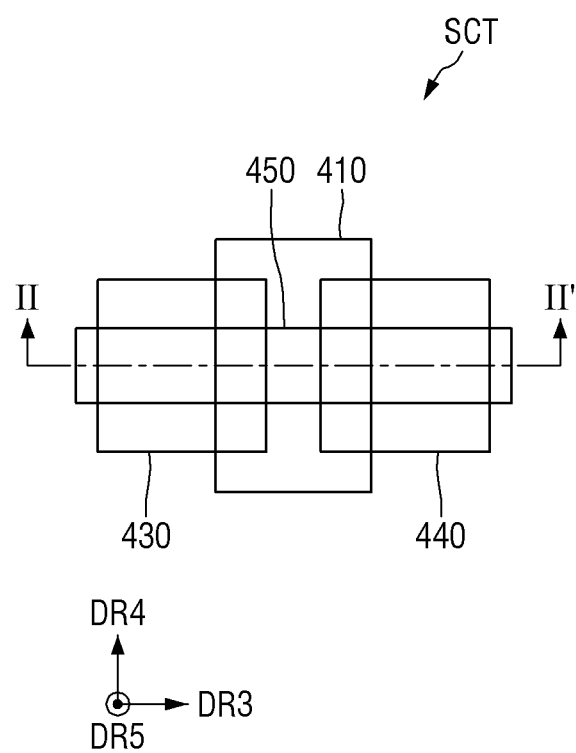
FIG. 6 is a plan view of a first switching transistor according to some example embodiments.
Figure 7:
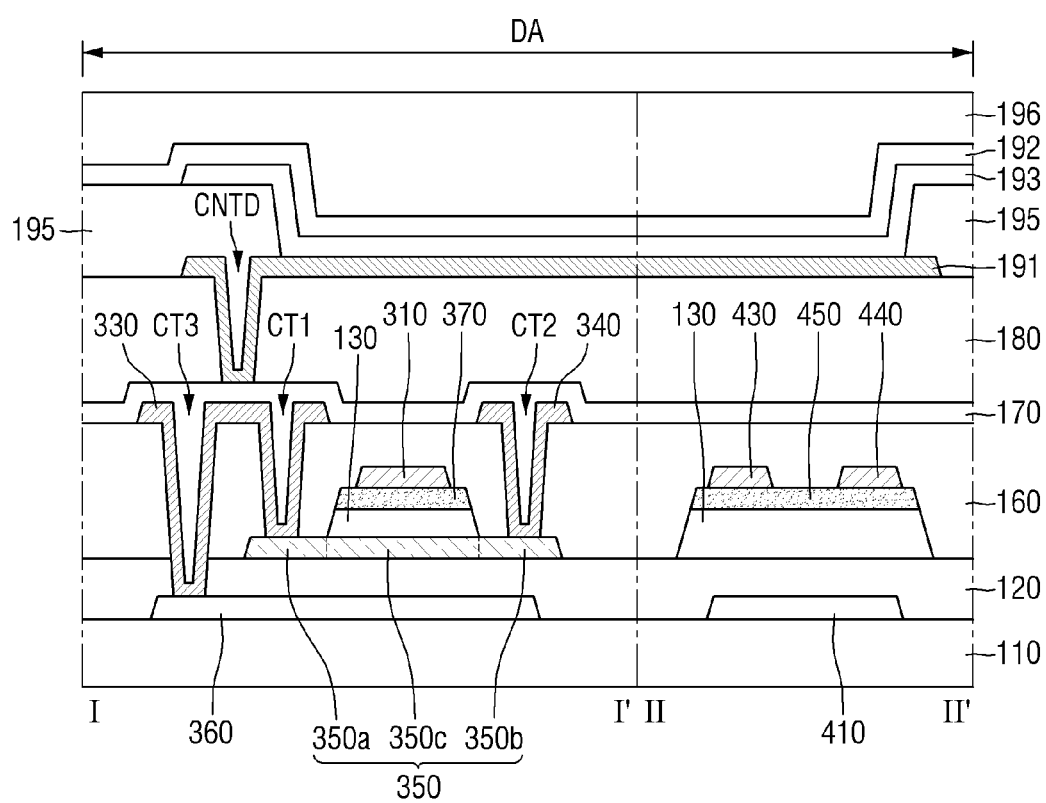
FIG. 7 is a cross-sectional view taken along the line I-I' of FIG. 5 and the line II-II' of FIG. 6.

FIG. 5 is a plan view of a driving transistor according to some example embodiments, FIG. 6 is a plan view of a first switching transistor according to some example embodiments, and FIG. 7 is a cross-sectional view taken along the line I-I' of FIG. 5 and the line II-II' of FIG. 6.

Referring to FIGS. 5 to 7, the display panel 10 may include a plurality of conductive layers and a plurality of semiconductor layers. The display panel 10 may include a first substrate 110, a buffer layer 120, a first gate insulating layer 130, a driving transistor DRT, a first switching transistor SCT, a first interlayer insulating layer 160, a first protective layer 170, a first planarization layer 180, a first electrode 191, an organic light emitting layer 192, a second electrode 193, a pixel defining film 195, and an encapsulation layer 196.

According to some example embodiments, the display device 1 may include a driving transistor DRT having a top-gate structure in which a gate electrode is formed on an active layer, and a first switching transistor SCT having a bottom-gate structure in which the gate electrode is formed under the active layer. The driving transistor DRT may further include an oxide layer located between the gate electrode and the active layer, and the first switching transistor SCT may include an active layer including the same material as the oxide layer of the driving transistor DRT. The first switching transistor SCT may have a bottom-gate structure in which the active layer may be located on the same layer as the oxide layer of the driving transistor DRT and the gate electrode may be located under the active layer.

Hereinafter, the driving transistor DRT and the first switching transistor SCT will be described in more detail.

According to some example embodiments, a plurality of pixels PXs may be located in the display area DA of the display device 1, and each of the pixels PX may include a driving transistor DRT and a first switching transistor SCT. The driving transistor DRT of each of the pixels PX includes a first active layer 350, a first oxide layer 370, a first gate electrode 310, a first source electrode 330, a first drain electrode 340, and a first light blocking layer 360. The first switching transistor SCT of the pixel PX includes a second gate electrode 410, a second active layer 450, a second source electrode 430, and a second drain electrode 440.

The first substrate 110 may provide an area in which the driving transistor DRT and the first switching transistor SCT are formed. The first substrate 110 may be made of plastic or glass.

A first conductive layer is located on the first substrate 110. The first conductive layer includes the first light blocking layer 360 of the driving transistor DRT and the second gate electrode 410 of the first switching transistor SCT.

The first light blocking layer 360 may be located on the first substrate 110. The first light blocking layer 360 may block light from being incident on the first active layer 350 from the first substrate 110. The first light blocking layer 360 may prevent or reduce a leakage current flowing through the first active layer 350 when light is incident on the first active layer 350 from the first substrate 110. The width of the first light blocking layer 360, measured in one direction, may be longer than the width of the first active layer 350, measured in one direction. However, embodiments according to the present invention are not limited thereto. The width of the first light blocking layer 360 may be shorter than the width of the first active layer 350, and may be longer than the width of a channel region 350c of the first active layer 350. The first light blocking layer 360 may have a single-layer structure or multi-layer structure made of any one of molybdenum (Mo), aluminum (Al), chromium (Cr), gold (Au), titanium (Ti), nickel (Ni), neodymium (Nd), and copper (Cu), or an alloy thereof.

The second gate electrode 410 is located on the first substrate 110. The second gate electrode 410 may overlap the second active layer 450 with the buffer layer 120 and the first gate insulating layer 130, which will be described later, interposed therebetween. The width of the second gate electrode 410, measured in one direction, may be shorter than the width of the second active layer 450, measured in one direction. However, embodiments according to the present invention are not limited thereto. The range of the width of the second gate electrode 410 is not particularly limited as long as the second gate electrode 410 has a width sufficient to overlap the channel region of the second active layer 450. The second gate electrode 410 may have a single-layer structure or multi-layer structure made of any one of molybdenum (Mo), aluminum (Al), chromium (Cr), gold (Au), titanium (Ti), nickel (Ni), neodymium (Nd), and copper (Cu), or an alloy thereof. As will be described later, the first switching transistor SCT may have a bottom-gate structure in which the second active layer 450 is located on the same layer as the first oxide layer 370 of the driving transistor DRT and the second gate electrode 410 is located under the second active layer 450.

The buffer layer 120 is located on the first conductive layer. The buffer layer 120 may be located on the first light blocking layer 360 and the second gate electrode 410. The buffer layer 120 may protect the driving transistor DRT and the first switching transistor SCT of the pixel PX from moisture passing through the first substrate 110. The buffer layer 120 may be formed of a plurality of inorganic layers that are alternately stacked. For example, the buffer layer 120 may be formed to have a multi-layer structure in which one or more inorganic layers of a silicon oxide layer (SiOx), a silicon nitride layer (SiNx), and a silicon oxynitride (SiON) are alternately stacked.

A first semiconductor layer including an oxide semiconductor is located on the buffer layer 120. The first semiconductor layer may include the first active layer 350 of the driving transistor DRT.

The first active layer 350 may be located on the buffer layer 120 to overlap the first light blocking layer 360. According to some example embodiments, the first active layer 350 may include an oxide semiconductor. According to some example embodiments, the first active layer 350 may include an oxide containing at least one of indium (In), gallium (Ga), zinc (Zn), tin (Sn), or hafnium (Hf). In some embodiments, the first active layer 350 may include Tin-Zinc Oxide (TZO), Tin-Gallium Oxide (TGO), Indium-Tin-Zinc Oxide (ITZO), Indium-Tin-Gallium Oxide (TZO) Indium-Tin-Gallium Oxide (ITGO), or Indium-Tin-Zinc-Gallium Oxide (ITZGO). However, embodiments according to the present invention are not limited thereto.

The driving transistor DRT may have a top-gate structure in which the first active layer 350 is located under the first gate electrode 310. The driving transistor DRT and the first switching transistor SCT of each pixel PX are located on the same first substrate 110, but have different structures, so that the first active layer 350 and the second active layer 450 may be located on different layers from each other. According to some example embodiments, the first active layer 350 of the driving transistor DRT may be located under the second active layer 450 of the first switching transistor SCT. As will be described later, the first oxide layer 370 may be located on the first active layer 350, and the second active layer 450 of the first switching transistor SCT may be located on the same layer as the first oxide layer 370. The driving transistor DRT may have a top-gate structure in which the first gate electrode 310 is located on the first oxide layer 370 and the first active layer 350 is located under the first oxide layer 370. Accordingly, the first active layer 350 of the driving transistor DRT may be located under a position where the second active layer 450 of the first switching transistor SCT is located.

Meanwhile, the first active layer 350 may include a first conducting region 350a, a second conducting region 350b, and a channel region 350c. The channel region 350c may be located between the first conducting region 350a and the second conducting region 350b. The first source electrode 330 and the first drain electrode 340, which will be described later, may be in contact with the first conducting region 350a and the second conducting region 350b.

The first gate insulating layer 130 is located on the first semiconductor layer. The first gate insulating layer 130 is located on the first active layer 350 and the second gate electrode 410. The first gate insulating layer 130 may be located directly on the first active layer 350, or may be located on the second gate electrode 410 with the buffer layer 120 interposed therebetween. The first gate insulating layer 130 may be formed of an inorganic material layer such as a silicon oxide (SiOx) layer or a silicon nitride (SiNx) layer, or may be formed to have a stacked structure thereof.

Meanwhile, although it is shown in the drawings that the first gate insulating layer 130 is located only between the first gate electrode 310 and the first active layer 350 and under the second active layer 450, embodiments according to the present invention are not limited thereto. That is, the first gate insulating layer 130 may be formed on the upper surface and side surfaces of the first active layer 350, and may also be located entirely on the buffer layer 120.

A second semiconductor layer including an oxide semiconductor may be located on the first gate insulating layer 130. According to some example embodiments, the second semiconductor layer may include a first oxide layer 370 located on the first active layer 350, a second oxide layer located on the second gate electrode 410, and a second active layer 450.

The driving transistor DRT may include a first active layer 350 having an oxide semiconductor and a first oxide layer 370. The first oxide layer 370 of the driving transistor DRT may be located on the first gate insulating layer 130 to overlap the first active layer 350. The first oxide layer 370 may be located to overlap at least the channel region 350c of the first active layer 350, and excess oxygen (O) may be injected into the channel region 350c of the first active layer 350. The width of the first oxide layer 370 measured in one direction may be shorter than the width of the first active layer 350 measured in one direction, and may be longer than the width of the channel region 350c of the first active layer 350. Although it is shown in the drawings that the width of the first oxide layer 370 is substantially the same as that of the channel region 350c of the first active layer 350, embodiments according to the present invention are not limited thereto.

The oxide semiconductor may partially form an oxygen defect region Vo according to the oxygen partial pressure during a deposition process. When an insulating layer is deposited on the oxide semiconductor, hydrogen (H) may be injected into the oxygen defect region Vo, which may increase the mobility of the oxide semiconductor. The number of oxygen defect regions Vo may be large such that the first active layer 350 of the driving transistor DRT may have high mobility. However, a large number of oxygen defect regions Vo may act as a factor that inhibits characteristics of the driving transistor DRT due to an excessive increase in the number of carriers.

The oxide layer may function as an oxygen supply layer that supplies excess oxygen (O) to another adjacent layer, that is, an insulating layer. Excess oxygen (O) supplied to the insulating layer may be injected into the channel region of the oxide semiconductor, and hydrogen (H) penetrated into the oxygen defective region Vo may be discharged to the insulating layer again. In this case, the number of carriers included in the oxide semiconductor may decrease, and characteristics as the driving transistor DRT can be secured.

According to some example embodiments, the driving transistor DRT may include a first oxide layer 370 located on the first active layer 350, and the first active layer 350 has high mobility and the characteristics of the transistor DRT may be improved. Moreover, in the driving voltage-driving current graph of the driving transistor DRT including the first oxide layer 370, the slope of a curve may decrease, and a wide range of driving voltage may be secured to drive the light emitting element EL of the pixel PX.

The first oxide layer 370 may be formed to overlap at least the channel region 350c of the first active layer 350 to inject excess oxygen O into the channel region 350c of the first active layer 350. Because the first oxide layer 370 located on the first gate insulating layer 130 has a width larger than that of the channel region 350c of the first active layer 350, the first oxide layer 370 may be located to overlap the entire channel region 350c. However, embodiments according to the present invention are not limited thereto. As shown in the drawings, the width of the first oxide layer 370 may be substantially the same as the width of the channel region 350c of the first active layer 350.

The first oxide layer 370 according to some example embodiments may include an oxide containing at least one of indium (In), gallium (Ga), zinc (Zn), tin (Sn), or hafnium (Hf). In some embodiments, the first oxide layer 370 may include tin-zinc oxide (TZO), tin-gallium oxide (TGO), indium-tin-zinc oxide (ITZO), indium-tin-gallium Oxide (ITGO), or indium-tin-zinc-gallium oxide (ITZGO). However, embodiments according to the present invention are not limited thereto.

The first active layer 350 of the first semiconductor layer may include the same kind of oxide semiconductor as the first oxide layer 370 of the second semiconductor layer. This configuration may be applied to the second active layer 450 of the second semiconductor layer to be described later. That is, the second active layer 450 and the first active layer 350 may include the same kind of oxide semiconductor or different kinds of oxide semiconductors. However, because the second active layer 450 and the first oxide layer 370 constitute the same second semiconductor layer, they may include the same kind of oxide semiconductor.

The second semiconductor layer may further include a second oxide layer or a second active layer 450 located on the first gate insulating layer 130 to overlap the second gate electrode 410. The first oxide layer 370 may function as an oxygen supply layer for supplying excess oxygen (O) to the first active layer 350 of the driving transistor DRT, whereas the second oxide layer or the second active layer 450 may form an active layer of the first switching transistor SCT.

The second active layer 450 of the first switching transistor SCT may be located on the same layer as the first oxide layer 370 of the driving transistor DRT, and may include the same material as the first oxide layer 370 thereof. That is, the second active layer 450 may include an oxide containing at least one of indium (In), gallium (Ga), zinc (Zn), tin (Sn), or hafnium (Hf). Because the first switching transistor SCT includes the second active layer 450 including the same oxide semiconductor as the first oxide layer 370, the number of manufacturing processes or operations of the display device 1 may be minimized or reduced, even when the driving transistor DRT includes the first oxide layer 370 including a different oxide semiconductor from the first active layer 350.

According to some example embodiments, the first active layer 350 of the driving transistor DRT may have a different component ratio from the second active layer 450 of the first switching transistor SCT. The driving transistor DRT may include a plurality of semiconductor layers, and may include a first active layer 350 and a first oxide layer 370 having an oxide semiconductor. In contrast, the first switching transistor SCT may include one semiconductor layer, that is, the second active layer 450. Unlike the driving transistor DRT, the first switching transistor SCT may have high mobility even when it does not include a separate oxygen supply layer. However, embodiments according to the present invention are not limited thereto.

The first switching transistor SCT may have a bottom-gate structure including a second active layer 450 including the same material as the first oxide layer 370, and a second gate electrode 410 located under the second active layer 450. The second active layer 450 may be in contact with the second source electrode 430 and the second drain electrode 440 which will be described later.

A second conductive layer may be located on the second semiconductor layer. The second conductive layer may include the first gate electrode 310 located on the first oxide layer 370 and the second source electrode 430 and second drain electrode 440 located on the second active layer 450.

The first gate electrode 310 is located on the first oxide layer 370. The first gate electrode 310 may overlap the first active layer 350 with the first oxide layer 370 interposed therebetween. For example, the first gate electrode 310 may overlap the channel region 350c of the first active layer 350. The first gate electrode 310 may include the same material as the second gate electrode 410. For example, the first gate electrode 310 may have a single-layer structure or multi-layer structure made of any one of molybdenum (Mo), aluminum (Al), chromium (Cr), gold (Au), titanium (Ti), nickel (Ni), neodymium (Nd), and copper (Cu), or an alloy thereof.

According to some example embodiments, the width of the first gate electrode 310 may be smaller than the width of the first oxide layer 370. Because the first gate electrode 310 and the first oxide layer 370 have different etching selectivity, the first oxide layer 370 may be more etched when they are etched during the same process. Accordingly, the side surface of the first oxide layer 370 may be recessed as compared with the side surface of the first gate electrode 310. When the side surface of the first oxide layer 370 is recessed, the insulating material of the first interlayer insulating layer 160 formed in a subsequent process is not deposited on the side surface of the first oxide layer 370, so that cracks may occur. This configuration may be a factor that deteriorates the characteristics and reliability of the driving transistor DRT.

According to some example embodiments, the first gate electrode 310 and the first oxide layer 370 may be formed through different etching processes from each other, and the first gate electrode 310 may have a narrower width than the first oxide layer 370. Accordingly, the formation of defects of the first interlayer insulating layer 160 can be prevented or reduced, and the structural stability of the driving transistor DRT may be secured to improve the characteristics and reliability of the driving transistor DRT. Because the first gate electrode 310 is located on the first oxide layer 370 and has a narrower width, at least a portion of the upper surface of the first oxide layer 370 may be exposed. The exposed upper surface of the first oxide layer 370 may be in contact with the first interlayer insulating layer 160.

The second source electrode 430 and the second drain electrode 440 of the second conductive layer are located on the second active layer 450. According to some example embodiments, the second source electrode 430 may be in contact with one side of the second active layer 450, and the second drain electrode 440 may be in contact with the other side of the second active layer 450. As shown in the drawing, the second source electrode 430 and the second drain electrode 440 may be located only on the second active layer 450, but embodiments according to the present invention are not limited thereto, and the second source electrode 430 and the second drain electrode 440 may also be located on the buffer layer 120. That is, the second source electrode 430 and the second drain electrode 440, including one side and the other side of the second active layer 450, respectively, may be located on the buffer layer 120 or the first gate insulating layer 130.

The second source electrode 430 and the second drain electrode 440 of the first switching transistor SCT may not necessarily be included in the second conductive layer. In some embodiments, the second source electrode 430 and the second drain electrode 440 of the first switching transistor SCT may be located on the first interlayer insulating layer 160, or may include a portion located on the second active layer 450 and a portion located on the first interlayer insulating layer 160.

The first interlayer insulating layer 160 is located on the second conductive layer. The first interlayer insulating layer 160 may be located on the first gate electrode 310, the second source electrode 430, and the second drain electrode 440, and may be formed of an inorganic material layer such as a silicon oxide (SiOx) layer or a silicon nitride (SiNx) layer, or may be formed to have a stacked structure thereof.

The first interlayer insulating layer 160 may be provided with a first contact hole CT1 penetrating the first interlayer insulating layer 160 to expose a portion of the upper surface of the first active layer 350, and a second contact hole CT2 penetrating the first interlayer insulating layer 160 to expose another portion of the upper surface of the first active layer 350. That is, the first contact hole CT1 may be formed to expose the first conducting region 350a of the first active layer 350, and the second contact hole CT2 may be formed to expose the second conducting region 350b of the first active layer 350. The first interlayer insulating layer 160 and the buffer layer 120 may be provided with a third contact hole CT3 penetrating the first interlayer insulating layer 160 and the buffer layer 120 to expose the first light blocking layer 360.

Meanwhile, the number of contact holes formed in the first interlayer insulating layer 160 is not limited thereto. In some embodiments, a larger number of contact holes may be formed in the first interlayer insulating layer 160 to expose a portion of the upper surface of the second active layer 450. Details thereof will be described later.

A third conductive layer is located on the first interlayer insulating layer 160. The third conductive layer may include a first source electrode 330 and a first drain electrode 340 of the driving transistor DRT. The first source electrode 330 is in contact with the first conducting region 350a formed at one side of the first active layer 350 through the first contact hole CT1. The first drain electrode 340 is in contact with the second conducting region 350b formed at the other side of the first active layer 350 through the second contact hole CT2.

Meanwhile, the third conductive layer may include a larger number of source electrodes and drain electrodes, or may include a plurality of conductive patterns. In some embodiments, the second source electrode 430 and the second drain electrode 440 of the first switching transistor SCT may be located on the first interlayer insulating layer 160 or connected to the conductive pattern of the third conductive layer to form one source electrode and one drain electrode. Details thereof will be described later.

The first protective layer 170 is located on the third conductive layer. The first protective layer 170 is located on the first source electrode 330 and the first drain electrode 340 of the driving transistor DRT. The first protective layer 170 may be formed of an inorganic material layer such as a silicon oxide (SiOx) layer or a silicon nitride (SiNx) layer, or may be formed to have a stacked structure thereof.

The first planarization layer 180 is located on the first protective layer 170. The first planarization layer 180 may flatten a step caused by thin film transistors such as the driving transistor DRT and the first switching transistor SCT. The first planarization layer 180 may be an organic film formed of an acrylic resin, an epoxy resin, a phenolic resin, a polyamide resin, or polyimide resin.

A light emitting element including a first electrode 191, an organic light emitting layer 192, and a second electrode 193, and a pixel defining film 195 may be formed on the first planarization layer 180.

The first electrode 191 may be formed on the first planarization layer 180. The first electrode 191 may be connected to the source electrode 330 of the driving transistor DRT through an electrode contact hole CNT penetrating the first protective layer 170 and the first planarization layer 180.

The pixel defining film 195 may be formed on the first planarization layer 180 to cover the edge of the first electrode 191 so as to divide the pixels. That is, the pixel defining film 195 serves as a pixel defining film that defines the pixels. Here, each of the pixels refers to an area where the first electrode 191, the organic light emitting layer 192, and the second electrode 193 are sequentially stacked, and thus holes from the first electrode 191 and electrons from the second electrode 193 are combined with each other to emit light.

The organic light emitting layer 192 may be located on the first electrode 191 and the pixel defining film 195. The organic light emitting layer 192 may include a hole transporting layer, a light emitting layer, and an electron transporting layer. The organic light emitting layer 192 may be formed to have a tandem structure of two or more stacks, and in this case, a charge generation layer may be formed between the stacks.

The second electrode 193 may be formed on the organic light emitting layer 192. The second electrode 193 may be a common layer commonly formed in the pixels.

The light emitting elements EL may be formed in a top emission manner in which they emit light in an upward direction. In this case, the first electrode 191 may be formed of a transparent conductive material (TCO) such as ITO or IZO, or a semi-transmissive conductive material such as magnesium (Mg), silver (Ag), or an alloy of magnesium (Mg) and silver (Ag). The second electrode 193 may be formed of a high-reflectance metal material such as a laminate structure (Ti/Al/Ti) of aluminum and titanium, a laminate structure (ITO/Al/ITO) of aluminum and TIO, an APC alloy, or a laminate structure (ITO/APC/ITO) of an APC alloy and ITO. When the second electrode 193 is formed of a semi-transmissive conductive material, light emission efficiency may be increased by microcavities.

The encapsulation layer 196 for preventing or reducing the permeation of oxygen or moisture may be formed on the second electrode 193. The encapsulation layer 196 may include at least one inorganic film. The inorganic film may be formed of silicon nitride, aluminum nitride, zirconium nitride, titanium nitride, hafnium nitride, tantalum nitride, silicon oxide, aluminum oxide, or titanium oxide. The encapsulation layer 196 may further include at least one organic film to prevent or reduce instances of foreign matter (particles) or contaminants penetrating the encapsulation layer 196 and entering the organic light emitting layer 192 and the second electrode 193. The organic film may be formed of epoxy, acrylate, and urethane acrylate.

The display device 1 according to some example embodiments may include a driving transistor DRT including a plurality of oxide semiconductors and a first switching transistor SCT including one oxide semiconductor. The driving transistor DRT includes a first active layer 350 and a first oxide layer 370 each including an oxide semiconductor, and the first active layer 350 and the first oxide layer 370 may be arranged to overlap each other. The first oxide layer 370 functions as an oxygen supply layer that supplies excess oxygen (O) to the first active layer 350, so that the driving transistor DRT can secure improved characteristics. The first switching transistor SCT may include a second active layer 450 including the same oxide semiconductor as the first oxide layer 370 of the driving transistor DRT. Even when the driving transistor DRT includes a plurality of oxide semiconductors, the first switching transistor SCT has a bottom-gate structure including the second active layer 450, and thus the number of manufacturing processes or operations can be minimized or reduced.

Meanwhile, the scan driver SDR may include a plurality of transistors, and each of them may be formed to be substantially the same as the first switching transistor SCT of each pixel PX.

Figure 8:
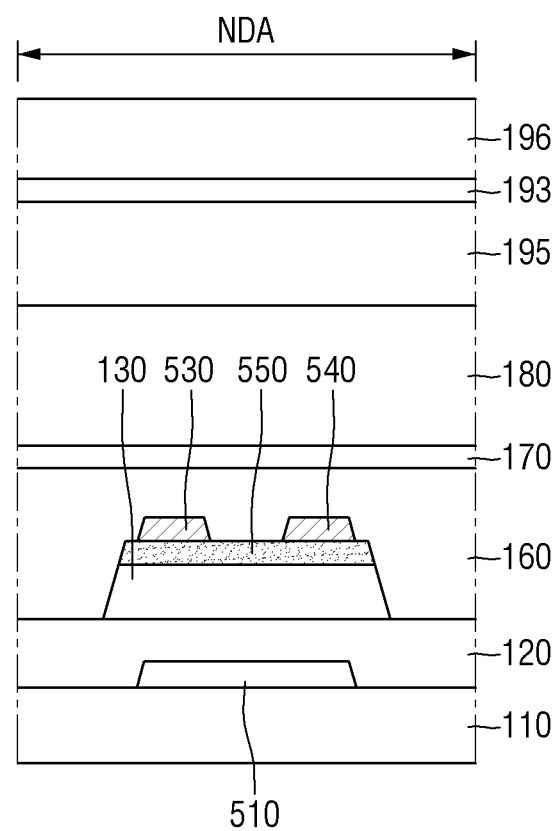
FIG. 8 is a schematic cross-sectional view of a second switching transistor according to some example embodiments.

FIG. 8 is a schematic cross-sectional view of a second switching transistor according to some example embodiments.

Referring to FIG. 8, the scan driver SDR is located in the non-display area NDA of the display device 1, and the scan driver SDR and the data distribution circuit DMUX may include at least one second switching transistor GPT. The second switching transistor GPT may include a third gate electrode 510, a third active layer 550, a third source electrode 530, and a third drain electrode 540.

According to some example embodiments, like the first switching transistor SCT of each pixel PX, the second switching transistor GPT may have a bottom-gate structure. The second switching transistor GPT may include a third active layer 550 located on the third gate electrode 510, and the third active layer 550 may be located on the same layer as the second active layer 450.

The first conductive layer may be arranged even on the non-display area NDA of the first substrate 110, and may include a third gate electrode 510 located in the non-display area NDA. The third gate electrode 510 may include the same material as the second gate electrode 410.

The buffer layer 120 may be located on the third gate electrode 510, and the first gate insulating layer 130 may be located on the buffer layer 120. The description of the buffer layer 120 and the first gate insulating layer 130 is the same as that described above with reference to FIG. 7.

The second semiconductor layer may further include a third active layer 550 located in the non-display area NDA and located on the first gate insulating layer 130 to overlap the third gate electrode 510. The third active layer 550 may include the same material as the second active layer 450. According to some example embodiments, the third active layer 550 may include an oxide containing at least one of indium (In), gallium (Ga), zinc (Zn), tin (Sn), or hafnium (Hf). The third active layer 550 may constitute the same second semiconductor layer as the first oxide layer 370 and the second active layer 450, and they may be formed in the same process. That is, even when the driving transistor DRT includes a plurality of oxide semiconductors, the third active layer 550 of the scan driver SDR may be formed without increasing the number of manufacturing processes.

The third active layer 550 is located to overlap the third gate electrode 510 with the buffer layer 120 and the first gate insulating layer 130 interposed therebetween. According to some example embodiments, the width of the third active layer 550 measured in one direction may be greater than the width of the third gate electrode 510 measured in one direction. However, embodiments according to the present invention are not limited thereto. The range of the width of the third gate electrode 510 is not particularly limited as long as the third gate electrode 510 has a width sufficient to overlap the channel region of the third active layer 550.

Because a description thereof is the same as, or similar to, the description of the first switching transistor SCT, some repetitive description thereof may be omitted.

The second conductive layer may include a third source electrode 530 and a third drain electrode 540 which are located on the third active layer 550. According to some example embodiments, the third source electrode 530 may be in contact with one side of the third active layer 550, and the third drain electrode 540 may be in contact with the other side of the third active layer 550. As shown in the drawing, the third source electrode 530 and the third drain electrode 540 may be located only on the third active layer 550. However, embodiments according to the present invention are not limited thereto, and the third source electrode 530 and the third drain electrode 540 may also be arranged even on the buffer layer 120.

The third source electrode 530 and the third drain electrode 540 of the second switching transistor GPT may not necessarily be included in the second conductive layer. In some embodiments, the third source electrode 530 and the third drain electrode 540 of the second switching transistor GPT may be located on the first interlayer insulating layer 160.

The first interlayer insulating layer 160 may be located on the third source electrode 530 and the third drain electrode 540. Description of the first interlayer insulating layer 160 is the same as that described above with reference to FIG. 7. Descriptions of the first protective layer 170, the first planarization layer 180, the pixel defining film 195, the second electrode 193, and the encapsulation layer 196, which are located on the first interlayer insulating layer 160, are the same as those described above.

The pull-up transistor TU and pull-down transistor TD of the scan driver SDR, and the plurality of transistors of a node controller NC may have the same structure as the second switching transistor GPT described above with reference to FIG. 8. Further, the first distribution transistors MT1 and the second distribution transistors MT2 of the data voltage distribution circuit DMUX may also have the same structure as the second switching transistor GPT described above with reference to FIG. 8.

Meanwhile, although it is shown in FIG. 8 that the second switching transistor GPT of the scan driver SDR located in the non-display area NDA has a bottom-gate structure, embodiments according to the present invention are not limited thereto. In some embodiments, the second switching transistor GPT of the scan driver SDR may have a top-gate structure like the driving transistor DRT, or the third active layer 550 may include polycrystalline silicon. A description thereof is referred to another embodiment.

Hereinafter, a method of manufacturing the display device 1 including the driving transistor DRT and the first switching transistor SCT will be described.

FIGS. 9 to 22 are cross-sectional views illustrating a process of manufacturing a display device according to some example embodiments.

Figure 9:
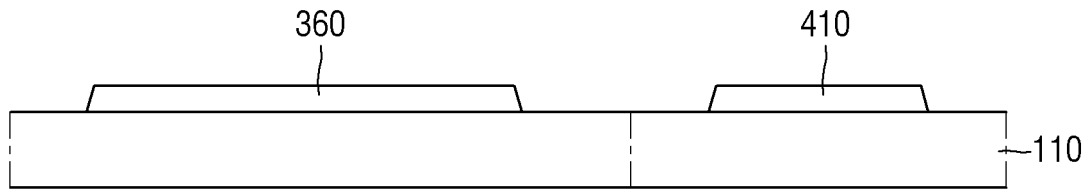
FIGS. 9 to 22 are cross-sectional views illustrating a process of manufacturing a display device according to some example embodiments.

First, referring to FIG. 9, a first conductive layer is formed on a first substrate 110. The first conductive layer includes a first light blocking layer 360 and a second gate electrode 410. According to some example embodiments, the first light blocking layer 360 and the second gate electrode 410 may be formed by patterning a metal layer formed on the first substrate 110 by sputtering through an etching process using a photoresist. However, embodiments according to the present invention are not limited thereto. According to some example embodiments, a process for forming a plurality of conductive layers and semiconductor layers is not particularly limited as long as it may be generally employed. Hereinafter, the formation order and structure of each member will be described in more detail, and some description of the process for forming them may be omitted.

Figure 10:
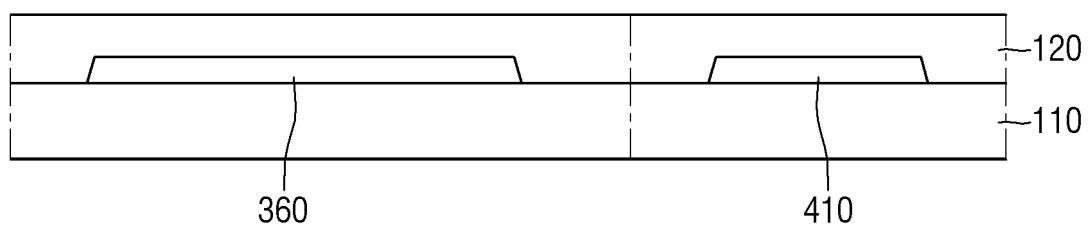

Next, referring to FIG. 10, a buffer layer 120 is formed on the first conductive layer. The buffer layer 120 may be formed on the first light blocking layer 360 and the second gate electrode 410, and may be formed on the entire surface of the first substrate 110. The buffer layer 120 may be formed by chemical vapor deposition, but embodiments according to the present invention are not limited thereto.

Figure 11:
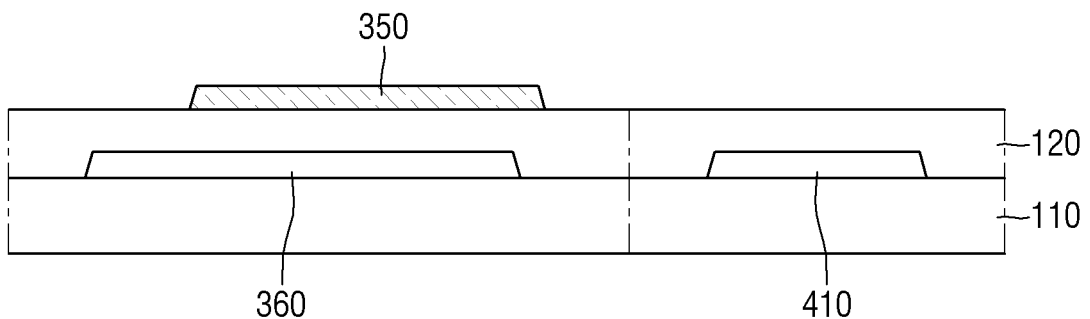

Next, referring to FIG. 11, a first semiconductor layer is formed on the buffer layer 120. The first semiconductor layer may include a first active layer 350, and the first active layer 350 may be located on the buffer layer 120 to overlap the first light blocking layer 360. The first active layer 350 may formed by a patterning process using a photoresist after forming one layer by sputtering. However, embodiments according to the present invention are not limited thereto, and in some cases, the first active layer 350 may formed by atomic layer deposition.

Figure 12:
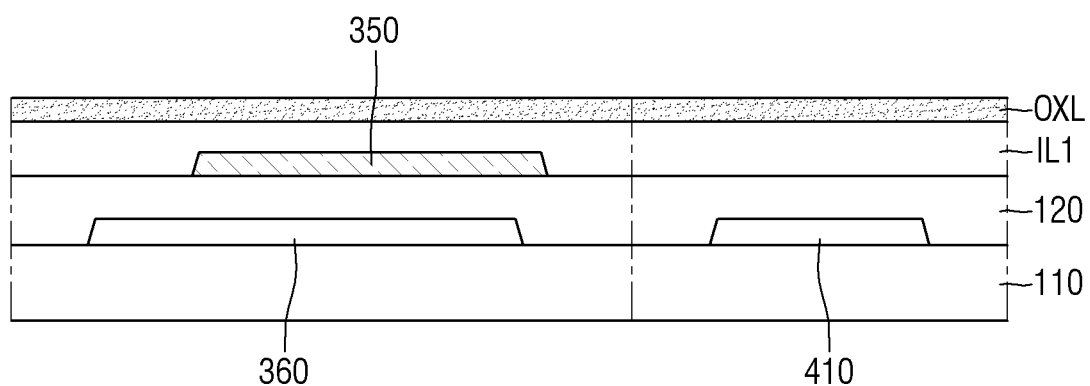

Next, referring to FIG. 12, a first insulating layer IL1 is formed on the first semiconductor layer, and an oxide semiconductor layer OXL is formed on the first insulating layer IL1. The first insulating layer IL1 and the oxide semiconductor layer OXL may be located on the buffer layer 120, and may be arranged to cover the first active layer 350 of the first semiconductor layer. The first insulating layer IL1 may be patterned in a subsequent process to form a first gate insulating layer 130, and the oxide semiconductor layer OXL may form a first oxide layer 370, a second active layer 450, and a third active layer 550 (shown in FIG. 8).

Figure 13:
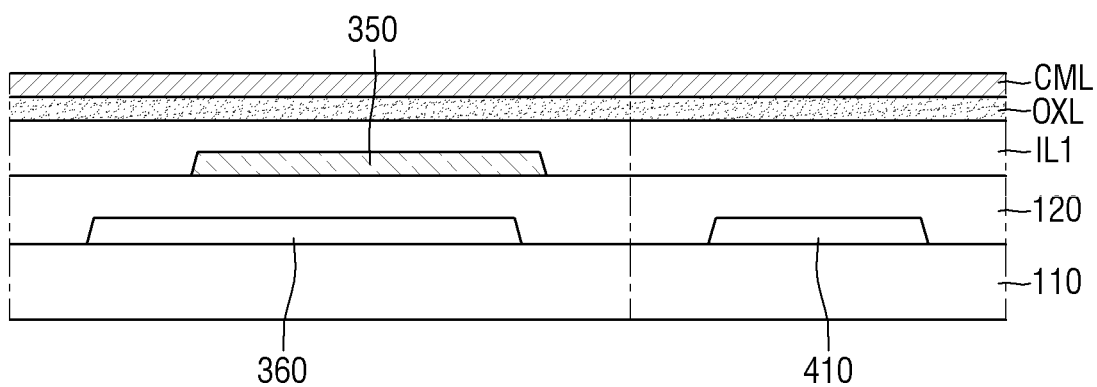

Next, referring to FIG. 13, a conductive metal layer CML is formed on the oxide semiconductor layer OXL. The conductive metal layer CML is entirely formed on the oxide semiconductor layer OXL, and may form a second conductive layer in a subsequent process. That is, the conductive metal layer CML may be patterned in a subsequent process to form a first gate electrode 310, a second source electrode 430, and a second drain electrode 440.

Figure 14:
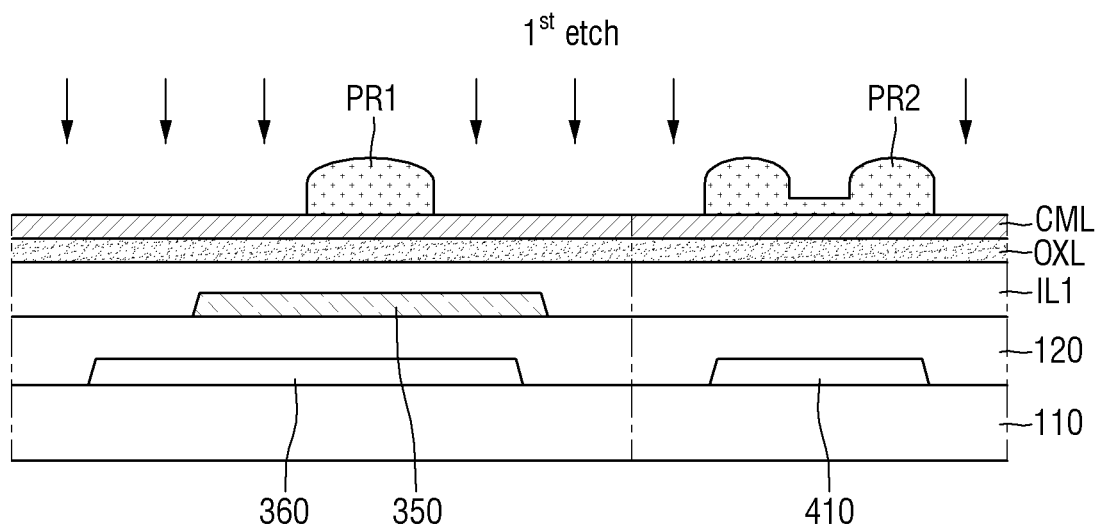

Next, referring to FIG. 14, photoresist layers PR1 and PR2 are formed on the conductive metal layer CML, and the oxide semiconductor layer OXL and the conductive metal layer CML are patterned. The photoresist layers PR1 and PR2 may include a first photoresist PR1 located on the first active layer 350 and a second photoresist PR2 located on the second gate electrode 410.

The first photoresist PR1 may function as a mask for forming the first gate electrode 310 and the first oxide layer 370. In some embodiments, the width of the first photoresist PR1 may be equal to the width of the first oxide layer 370. As described above, the first gate electrode 310 may be patterned in a process different from that of the first oxide layer 370. After the first oxide layer 370 is formed, the first photoresist PR1 may be partially patterned to have a narrower width (PR1' in FIG. 18), and may become a mask for forming the first gate electrode 310.

The second photoresist PR2 may function as a mask for forming the second source electrode 430 and the second drain electrode 440. According to some example embodiments, the second photoresist PR2 may be exposed to light by a half-tone mask to recess a portion thereof. The recessed portion of the second photoresist PR2 may be patterned and removed in a subsequent process (PR2' in FIG. 18), and the second photoresist PR2 remaining on the conductive metal layer CML may become a mask for forming the second source electrode 430 and the second drain electrode 440.

As shown in FIG. 14, when a first etching process of etching the conductive metal layer CML and the oxide semiconductor layer OXL along the photoresist layers PR1 and PR2 is performed, the oxide semiconductor layer OXL and the conductive metal layer CML may be patterned at the same time, and the oxide semiconductor layer OXL may form the first oxide layer 370 and the second active layer 450.

Figure 15:
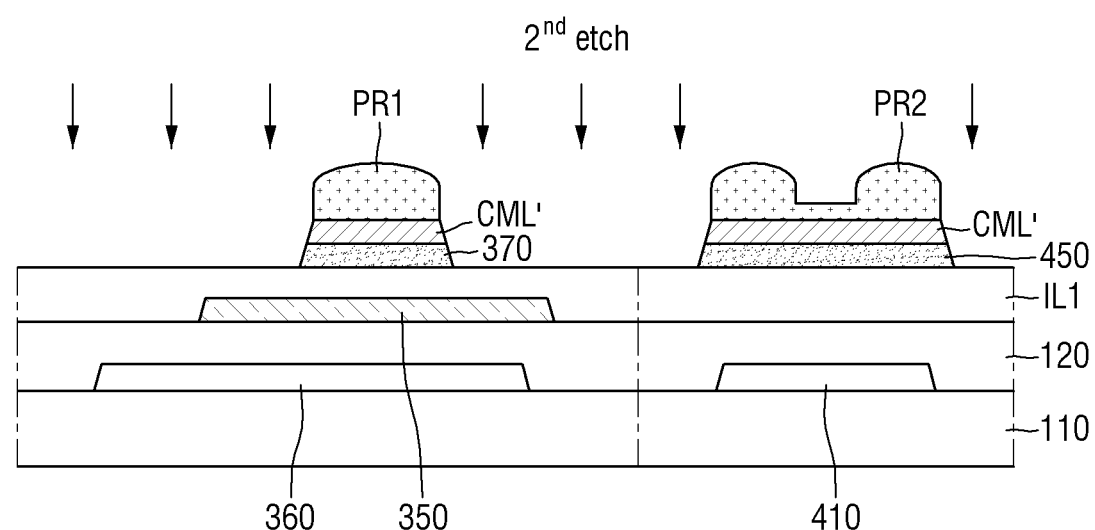

Referring to FIG. 15, the first oxide layer 370 may be formed under the first photoresist PR1, and the second active layer 450 may be formed under the second photoresist PR2. A portion of the conductive metal layer CML may be removed to be formed between the first oxide layer 370 and the first photoresist PR1 and between the second active layer 450 and the second photoresist PR2 (CML' in FIG. 15). Meanwhile, in some embodiments, the conductive metal layer CML and the oxide semiconductor layer OXL may have a different etching selectivity from the first insulating layer IL1. The first insulating layer IL1 may be patterned in a subsequent process to form a first gate insulating layer 130.

Figure 16:
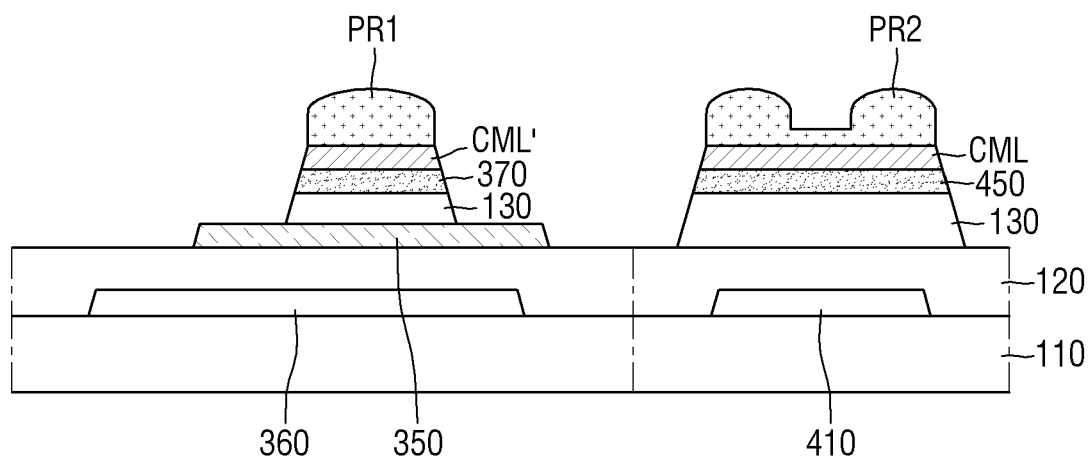

Referring to FIG. 16, a second etching process of etching the first insulating layer IL1 along the photoresist layers PR1 and PR2 is performed to form a first gate insulating layer 130. The first gate insulating layer 130 may be located between the first active layer 350 and the first oxide layer 370 and between the buffer layer 120 and the second active layer 450.

Figure 17:
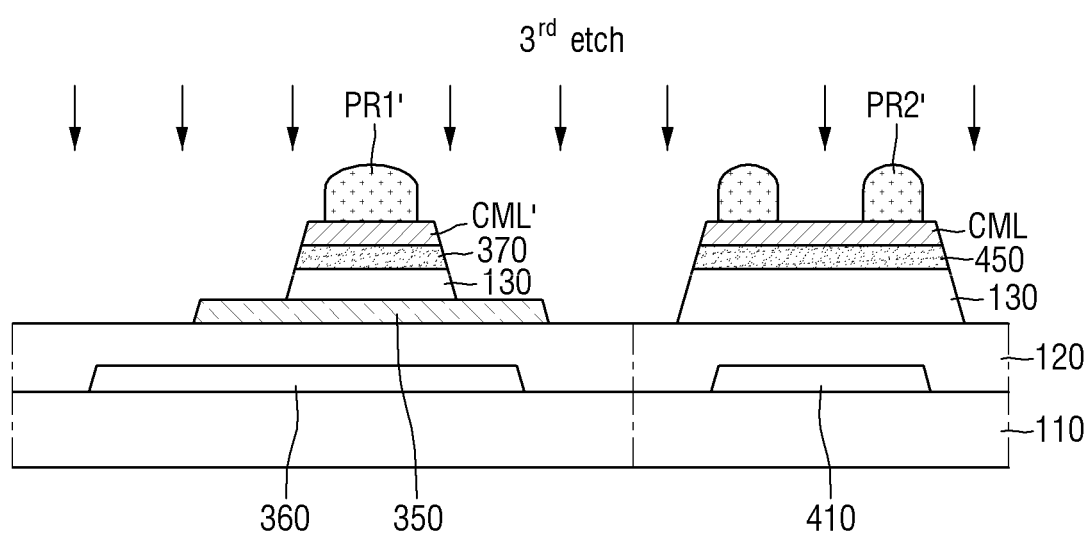

Subsequently, the first photoresist PR1 and the second photoresist PR2 are partially etched. Referring to FIG. 17, the first photoresist PR1 may be partially etched to narrow the width thereof (PR1' in FIG. 17). Accordingly, the conductive metal layer CML' on the first oxide layer 370 may be partially exposed. The etched first photoresist PR1' has a width narrower than the width of the first oxide layer 370, and may become a mask for forming the first gate electrode 310 in a subsequent process. The recessed portion of the second photoresist PR2 may be removed to partially expose the conductive metal layer CML' on the second active layer 450. The etched second photoresist PR2' may become a mask for forming the second source electrode 430 and the second drain electrode 440.

Next, a third etching process (3rd etch) of patterning the conductive metal layer CML' along the etched first photoresist PR1' and second photoresist PR2' is formed to a second conductive layer.

Figure 18:
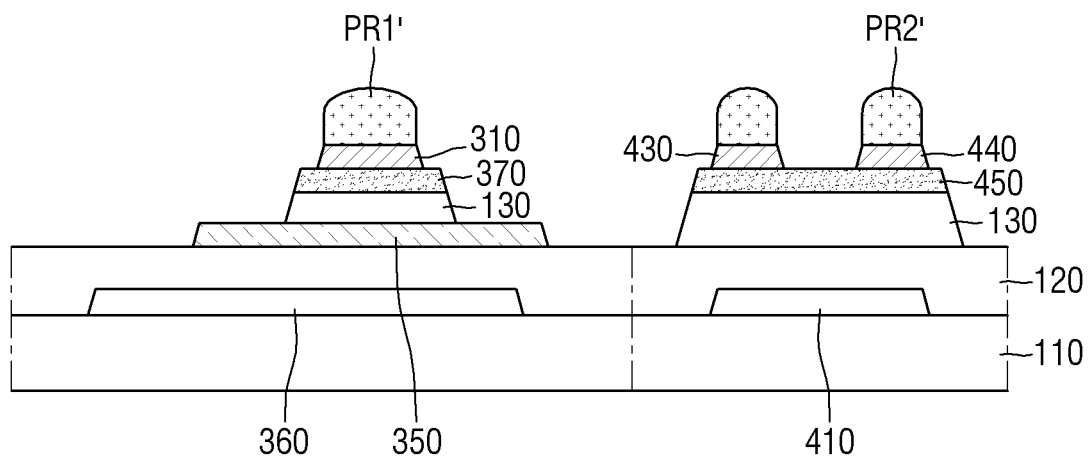

Referring to FIG. 18, the conductive metal layer CML' is patterned to form a first gate electrode 310 on the first oxide layer 370 and form a second source electrode 430 and a second drain electrode 440 on the second active layer 450. Descriptions thereof are the same as those described above.

Figure 19:
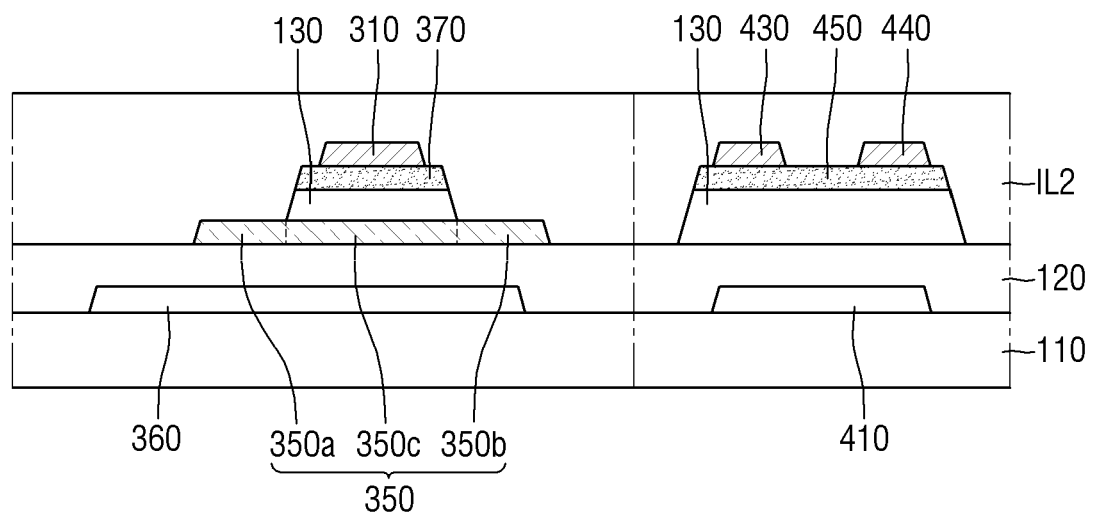

Next, referring to FIG. 19, the etched first photoresist PR1' and the etched second photoresist PR2' are removed, and a second insulating layer IL2 is formed on the second conductive layer. Before forming the second insulating layer IL2, a portion of the first active layer 350 is conducted to form a first conducting region 350a, a second conducting region 350b, and a channel region 350c. The second insulating layer IL2 may be partially etched in a subsequent process to form the first interlayer insulating layer 160.

Figure 20:
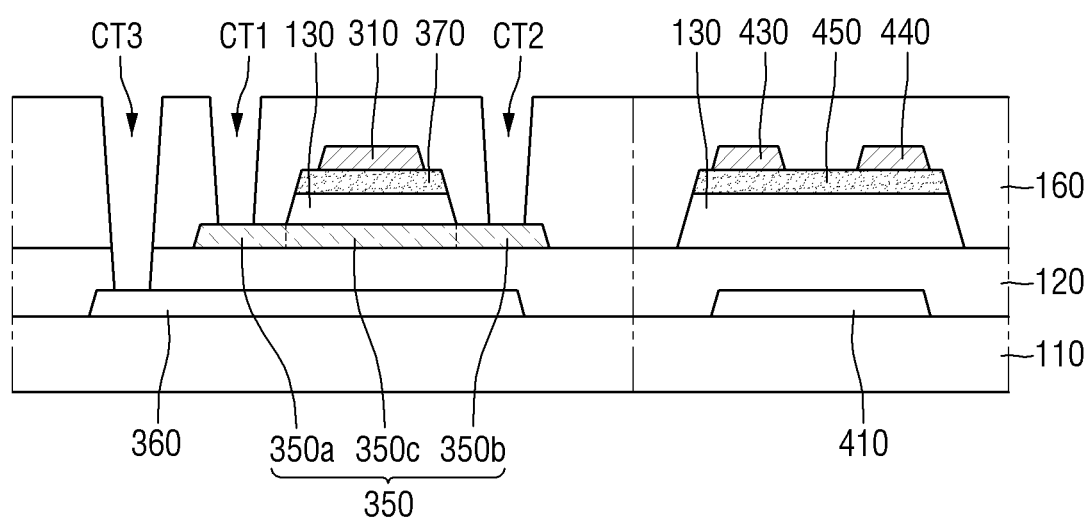

Referring to FIG. 20, a plurality of contact holes CT1, CT2, and CT3 are formed in the second insulating layer IL2 to form the first interlayer insulating layer 160. The first contact hole CT1, the second contact hole CT2, and the third contact hole CT3 may be formed in the first interlayer insulating layer 160. The description thereof is the same as described above.

Figure 21:
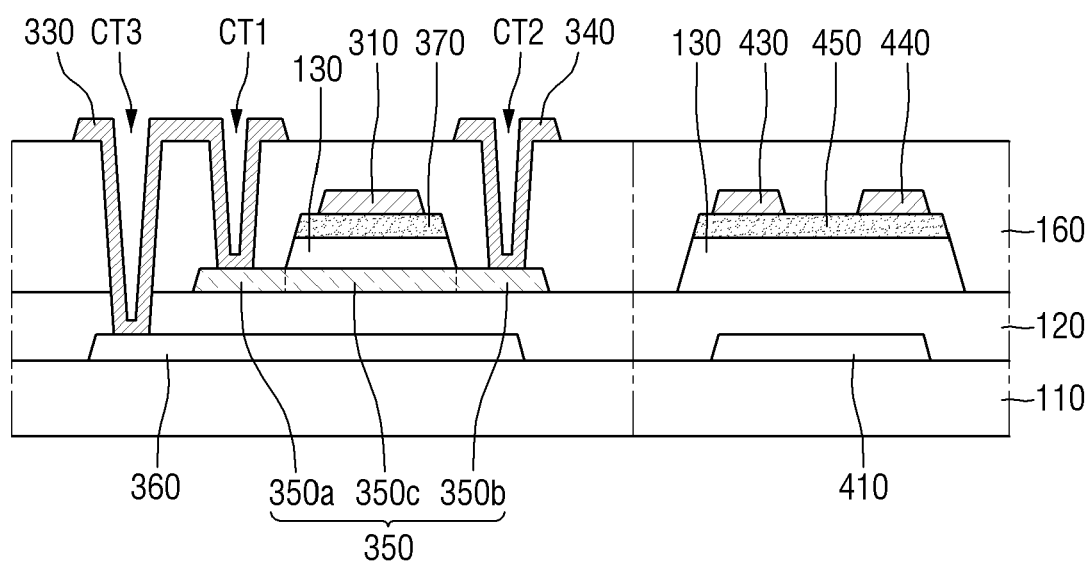

Next, referring to FIG. 21, a third conductive layer is formed on the first interlayer insulating layer 160. The third conductive layer may include a first source electrode 330 and a first drain electrode 340. The first source electrode 330 may be in contact with the first conducting region 350a through the first contact hole CT1, and may simultaneously be in contact with the first light blocking layer 360 through the third contact hole CT3. The first drain electrode 340 may be in contact with the second conductive region 350b through the second contact hole CT2.

Figure 22:
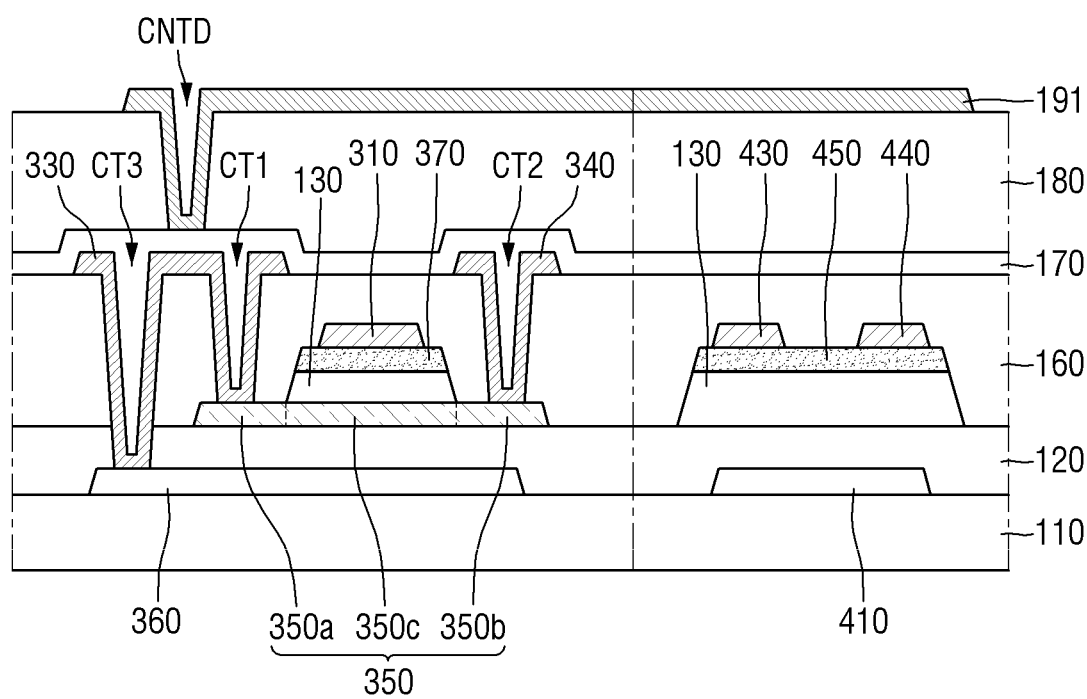

Subsequently, referring to FIG. 22, a first protective layer 170 located on the third conductive layer and a first planarization layer 180 located on the first protective layer 170 are formed, and an electrode contact hole CNT for exposing the first source electrode 330 and a first electrode 191 are formed on the first planarization layer 180. Because a description of these structures is the same as that described above, some repetitive description thereof may be omitted.

Subsequently, according to some example embodiments, an organic light emitting layer 192, a pixel defining film 195, a second electrode 193, and an encapsulation layer 196 are formed on the first electrode 191 to manufacture the display device 1.

Hereinafter, a structure of the first switching transistor SCT according to some example embodiments will be described.

Figure 23:
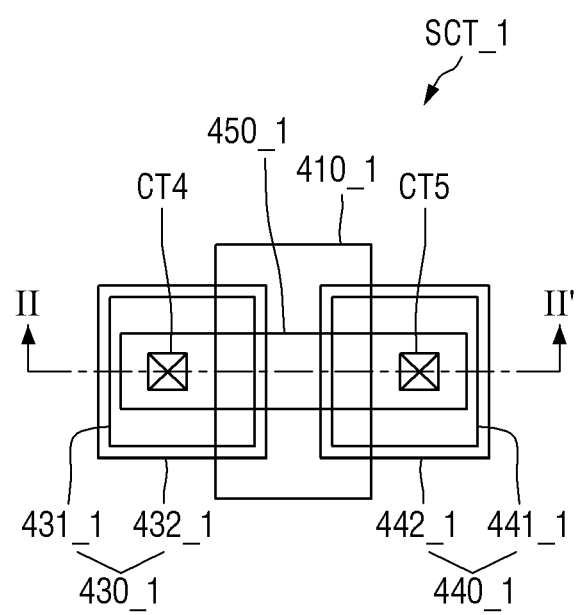
FIG. 23 is a plan view of a first switching transistor according to some example embodiments.
Figure 24:
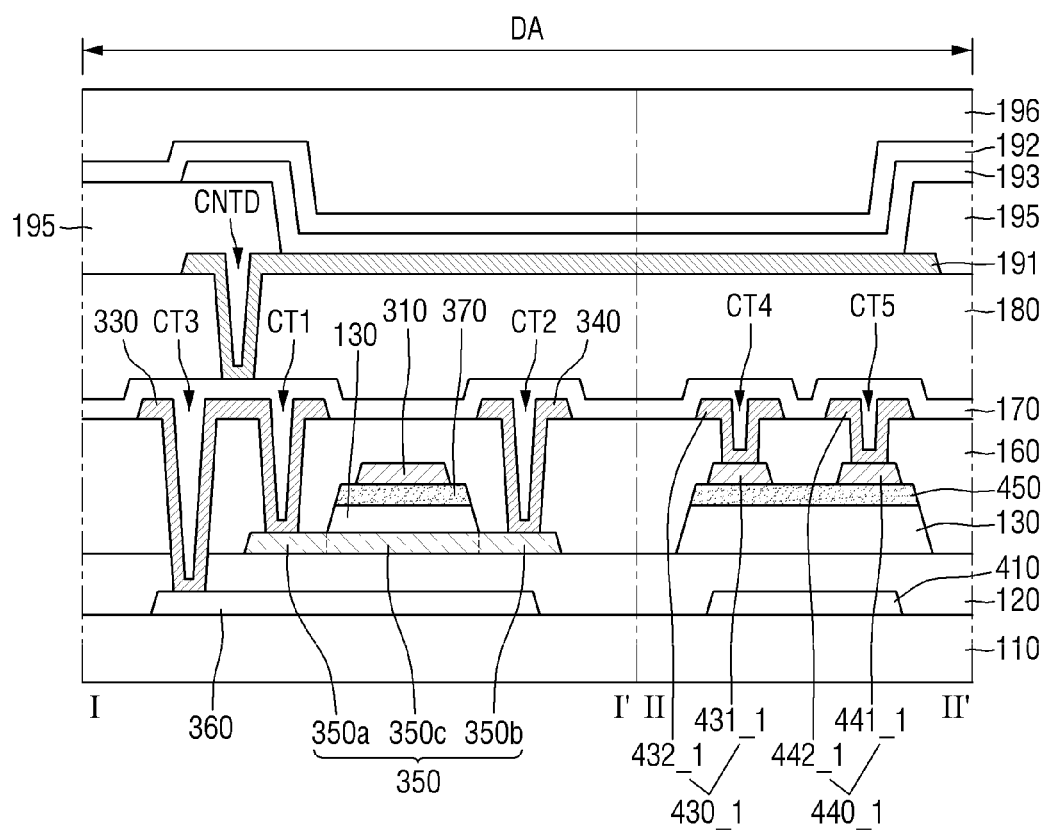
FIG. 24 is a cross-sectional view taken along the line I-I' of FIG. 5 and the line II-II' of FIG. 23.

FIG. 23 is a plan view of a first switching transistor according to some example embodiments, and FIG. 24 is a cross-sectional view taken along the line I-I' of FIG. 5 and the line II-II' of FIG. 23.

According to some example embodiments, in a first switching transistor SCT_1 of the display device 1, a second source electrode 430_1 and a second drain electrode 440_1 may include a conductive pattern located in the second conductive layer and a conductive pattern located in the third conductive layer, respectively. That is, the second source electrode 430_1 and the second drain electrode 440_1 of the first switching transistor SCT_1 may further include a conductive pattern located on the first interlayer insulating layer 160.

Referring to FIGS. 23 and 24, the third conductive layer may include a second source electrode 430_1 and a second drain electrode 440_1 in addition to the first source electrode 330 and the first drain electrode 340. The display device 1 of the present embodiment is different from the display device 1 of the embodiment of FIG. 7 in that The second source electrode 430_1 and the second drain electrode 440_1 of the first switching transistor SCT_1 may have a plurality of conductive patterns forming one source electrode and one drain electrode. Hereinafter, some redundant descriptions may be omitted, and differences will be mainly described.

The display device 1 of FIGS. 23 and 24 may include a first conductive pattern 431_1 and a second conductive pattern 441_1 included in the second conductive layer, and a third conductive pattern 432_1 and a fourth conductive pattern 442_1 included in the third conductive layer. The first conductive pattern 431_1 and the third conductive pattern 432_1 may constitute a second source electrode 430_1 of the first switching transistor SCT_1, and the second conductive pattern 441_1 and the fourth conductive pattern 442_1 may constitute a second drain electrode 440_1 of the first switching transistor SCT_1.

The first conductive pattern 431_1 and the second conductive pattern 441_1 of the second conductive layer may be in contact with one side and the other side of the second active layer 450, respectively. The first conductive pattern 431_1 and the second conductive pattern 441_1 may be substantially the same as the second source electrode 430 and the second drain electrode 440 in the embodiment of FIG. 7.

The first interlayer insulating layer 160 may be provided with a fourth contact hole CT4 penetrating the first interlayer insulating layer 160 to expose a portion of the upper surface of the second active layer 450 and a fifth contact hole CT5 penetrating the first interlayer insulating layer 160 to expose another portion of the upper surface of the second active layer 450.

The third conductive pattern 432_1 and the fourth conductive pattern 442_1 of the third conductive layer may be in contact with the first conductive pattern 431_1 and the second conductive pattern 441_1, respectively. The third conductive pattern 432_1 may be in contact with the first conductive pattern 431_1 through the fourth contact hole CT4 penetrating the first interlayer insulating layer 160 to expose a portion of the upper surface of the first conductive pattern 431_1. The fourth conductive pattern 442_1 may be in contact with the second conductive pattern 441_1 through the fifth contact hole CT5 penetrating the first interlayer insulating layer 160 to expose a portion of the upper surface of the second conductive pattern 441_1.

According to some example embodiments, the second source electrode 430_1 may include a first conductive pattern 431_1 contacting one side of the second active layer 450_1 and a third conductive pattern 432_1 contacting the first conductive pattern 431_1 through the fourth contact hole CT4. The second drain electrode 440_1 may include a second conductive pattern 441_1 contacting the other side of the second active layer 450_1 and a fourth conductive pattern 442_1 contacting the second conductive pattern 441_1 through the fifth contact hole CT5.

According to some example embodiments, even in the case of the second active layer 450, a first conducting region, a second conducting region, and a channel region therebetween may be formed. For example, the second source electrode 430_1 may be in contacts with the first conducting region formed on one side of the second active layer 450, and the second drain electrode 440_1 may be in contact with the second conducting region formed on the other side of the second active layer 450.

Meanwhile, as described above, the first conductive pattern 431_1 and the second conductive pattern 441_1 located on the second active layer 450_1 may not be necessarily located only on the second active layer 450_1. The first conductive pattern 431_1 and the second conductive pattern 441_1, each including one side and the other side of the second active layer 450_1, may be located even on the buffer layer 120 or the first gate insulating layer 130, respectively. The third conductive pattern 432_1 and the fourth conductive pattern 442_1 may not be necessarily in contact with the first conductive pattern 431_1 and the second conductive pattern 441_1 on the second active layer 450_1, respectively, and may be in contact with the first conductive pattern 431_1 and the second conductive pattern 441_1 located on the buffer layer 120 or the first gate insulating layer 130, respectively.

This first switching transistor SCT_1 may be manufactured by further forming the third conductive pattern 432_1 and the fourth conductive pattern 442_1 in the process of forming the third conductive layer in the manufacturing process of the embodiment of FIG. 7. In the first switching transistor SCT_1 of FIGS. 23 and 24, a portion of the second source electrode 430_1 and a portion of the second drain electrode 440_1 may be formed in a process different from that of the first gate electrode 310. In the process of forming the first gate electrode 310, the first conductive pattern 431_1 and the second conductive pattern 441_1 may be formed on the second active layer 450_1. Then, in the process of forming the third conductive layer, the third conductive pattern 432_1 and the fourth conductive pattern 442_1 may be formed simultaneously with the first source electrode 330 and the first drain electrode 340. The first interlayer insulating layer 160 may be further provided with the fourth contact hole CT4 and the fifth contact hole CT5, and the second source electrode 430_1 and the second drain electrode 440_1 may be in contact with the second active layer 450_1.

Figure 25:
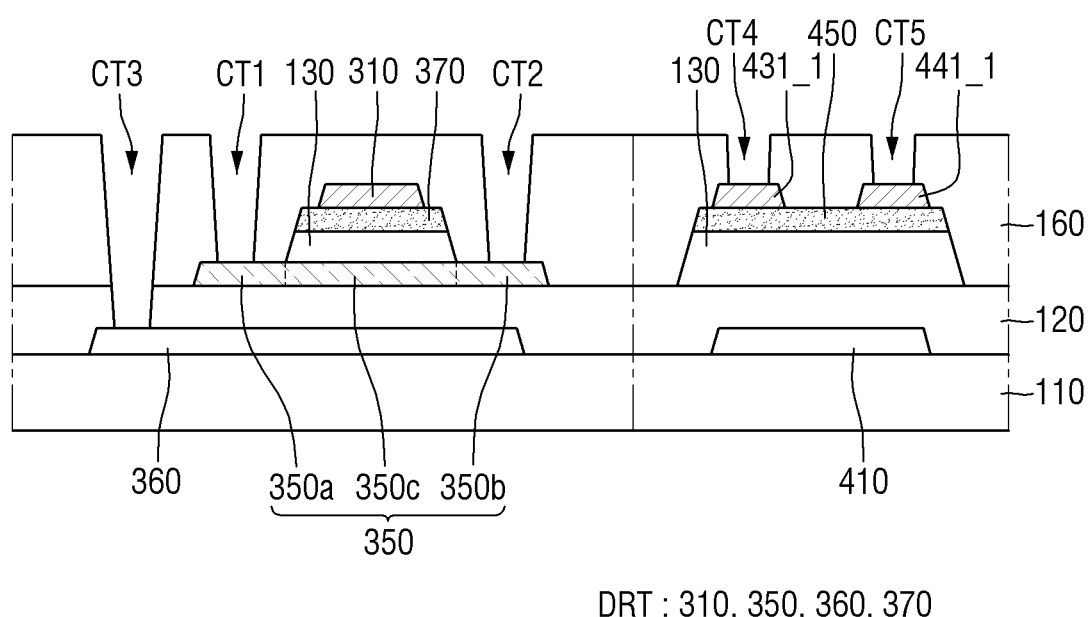
FIGS. 25 and 26 are cross-sectional views illustrating a part of a process of manufacturing the display device of FIG. 24.
Figure 26:
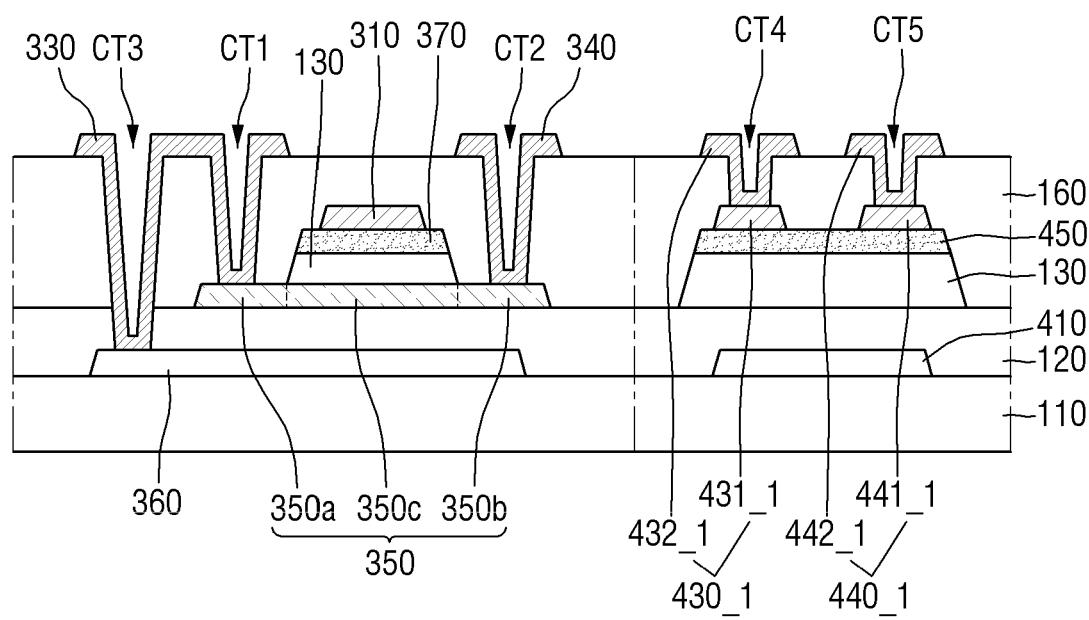

FIGS. 25 and 26 are cross-sectional views illustrating a part of the process of manufacturing the display device of FIG. 24.

First, referring to FIG. 25, in the process of forming a plurality of contact holes in the first interlayer insulating layer 160, a fourth contact hole CT4 and a fifth contact hole CT5 exposing portions of the upper surfaces of the first conductive pattern 431_1 and the second conductive pattern 441_1 are formed.

Subsequently, referring to FIG. 26, in the process of forming the third conductive layer, a third conductive pattern 432_1 contacting the first conductive pattern 431_1 through the fourth contact hole CT4 and a fourth conductive pattern 442_1 contacting the second conductive pattern 441_1 through the fifth contact hole CT5 are formed. The plurality of conductive patterns of the second conductive layer and the third conductive layer may constitute the second source electrode 430_1 and the second drain electrode 440_1 of the first switching transistor SCT_1, respectively.

In the display device 1 according to some example embodiments, a plurality of data lines DTL may be located in each of the pixels PX arranged in the same column. Source electrodes of the first switching transistors SCT of each of the pixels PX may be connected to different data lines DTL. According to some example embodiments, two data lines DTL may be located in each of the pixels PX, and some of the first switching transistors SCT located in each of the pixels PX may be connected to any first data line DTL and others thereof may be connected to any second data line DTL. That is, the display device 1 may include a first pixel in which the first switching transistor SCT is connected to the first data line, and a second pixel in which the first switching transistor SCT is connected to the second data line. However, embodiments according to the present invention are not limited thereto.

A large number of pixels PX may be located in the display area DA of the display device 1, and the data line DTL located in each of the pixels PX may be connected to a data distribution circuit DMUX of the non-display area NDA. In the routing line RL of the data distribution circuit DMUX, one wire may be divided into two data lines DTL and located in each of the plurality of pixels PX. Even when the data distribution circuit DMUX is connected to a small number of routing lines RL, data lines DTL may be located in a large number of pixels PX, and the space in which the data distribution circuit DMUX is located may be narrowed. That is, the non-display area NDA of the display device 1 may be minimized or reduced.

Meanwhile, as described above, some of the second switching transistors GPT included in the scan driver SDR and the data distribution circuit DMUX in the non-display area NDA have a top gate structure unlike in the embodiment of FIG. 8, or the third active layer 550 may include polycrystalline silicon.

Figure 27:
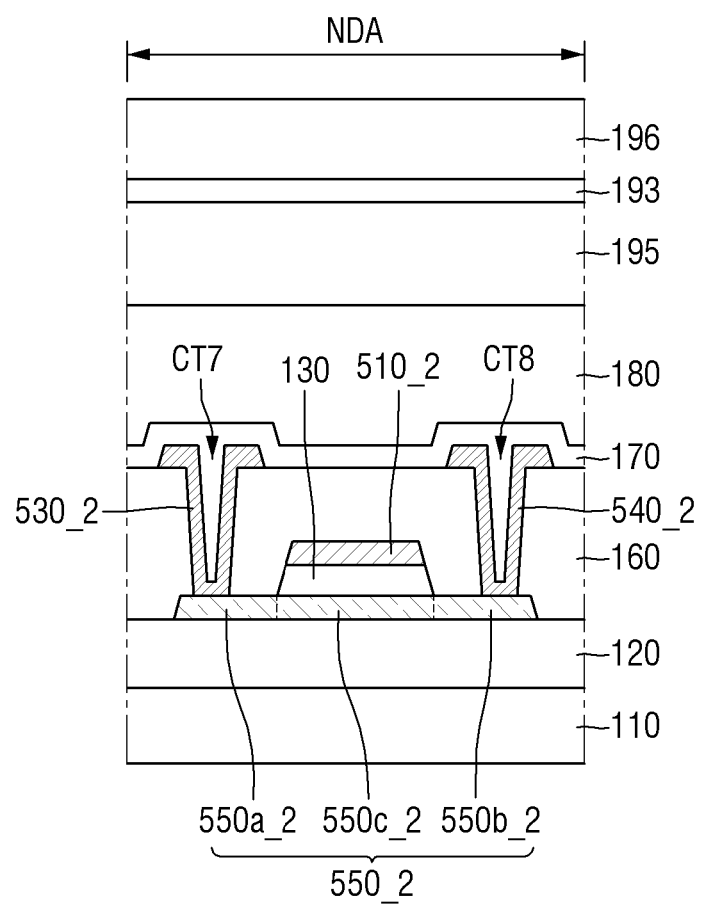
FIGS. 27 and 28 are cross-sectional views of second switching transistors according to some example embodiments.
Figure 28:
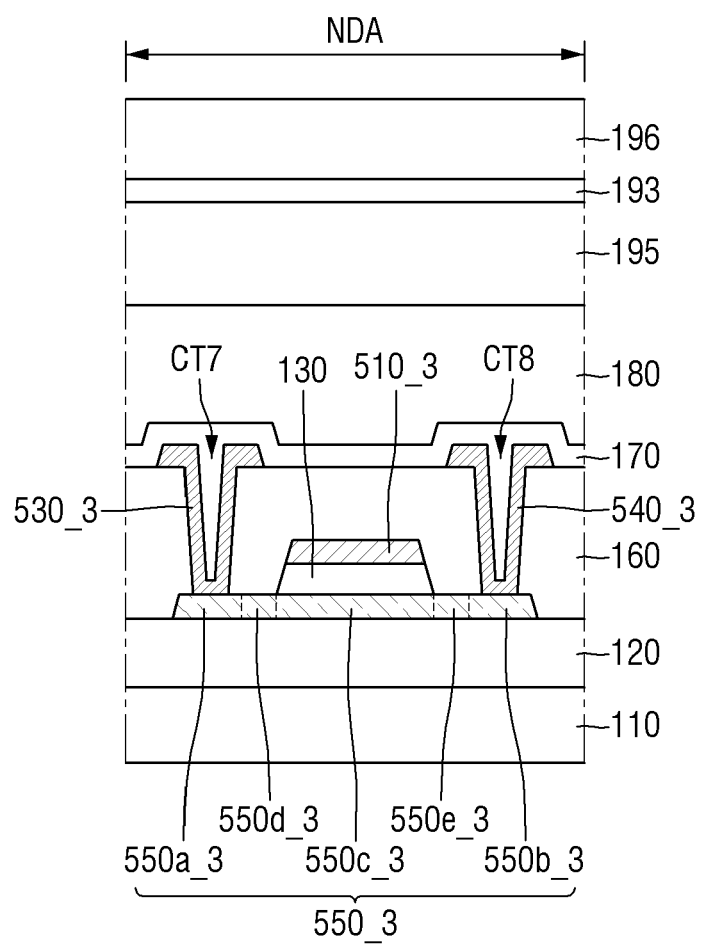

FIGS. 27 and 28 are cross-sectional views of second switching transistors according to other embodiments.

Referring to FIG. 27, in a second switching transistor GPT_2 according to some example embodiments, a third active layer 550_2 may be located under a third gate electrode 510_2. The second switching transistor GPT_2 of FIG. 27 is different from the second switching transistor GPT of the embodiment of FIG. 8 in that it has a top-gate structure. Hereinafter, some redundant description may be omitted, and differences will be mainly described.

The second switching transistor GPT_2 of FIG. 27 includes a third active layer 550_2, a third gate electrode 510_2, a third source electrode 530_2, and a third drain electrode 540_2.

In the display device 1 according to some example embodiments, the second switching transistors GPT of the scan driver SDR and the data distribution circuit DMUX located in non-display area NDA may have a bottom-gate structure in which the third gate electrode 510 is located under the third active layer 550 as described in the embodiment of FIG. 8, or may have a top-gate structure in which the third gate electrode 510_2 is located on the third active layer 550_2 as described in the embodiment of FIG. 27. The second switching transistor GPT is not necessarily limited to have only one of these structures, and the second switching transistor GPT having a bottom-gate structure may be combined with the second switching transistor GPT_2 having top-gate structure in the non-display area NDA. In the second switching transistor GPT of FIG. 8, the third active layer 550 may include the same oxide semiconductor as the first oxide layer 370 of the driving transistor DRT and the second active layer 450 of the first switching transistor SCT located in the display area DA. In contrast, in the second switching transistor GPT_2 of FIG. 27, the third active layer 550_2 may include the same oxide semiconductor as the first active layer 350 of the driving transistor DRT located in the display area DA.

The first semiconductor layer may include a third active layer 550_2 of the second switching transistor GPT_2. Unlike that of the embodiment of FIG. 8, the third active layer 550_2 may include the same oxide semiconductor as the first active layer 350 of the driving transistor DRT. The third active layer 550_2 may be located on the buffer layer 120. The third active layer 550_2 may include a third conducting region 550a_2, a fourth conducting region 550b_2, and a channel region 550c_2. The channel region 550c_2 may be located between the third conducting region 550a_2 and the fourth conducting region 550b_2. The third source electrode 530_2 and the third drain electrode 540_2 may be in contact with the third conducting region 550a_2 and the fourth conducting region 550b_2.

The first gate insulating layer 130 is located on the third active layer 550_2. The description of the first gate insulating layer 130 is the same as that described above with reference to FIG. 8.

The third gate electrode 510_2 is located on the first gate insulating layer 130. The third gate electrode 510_2 may overlap the third active layer 550_2 with the first gate insulating layer 130 interposed therebetween. For example, the third gate electrode 510_2 may overlap the channel region 550c_2 of the third active layer 550_2. Besides, the description of the third gate electrode 510_2 is the same as that described above with reference to the first gate electrode 310.

The first interlayer insulating layer 160 is located on the third gate electrode 510_2. The first interlayer insulating layer 160 may be provided with a seventh contact hole CT7 penetrating the first interlayer insulating layer 160 to expose a portion of the upper surface of the third active layer 550_2 and an eighth contact hole CT8 penetrating the first interlayer insulating layer 160 to expose another portion of the upper surface of the third active layer 550_2. The seventh contact hole CT7 may be formed to expose the third conducting region 550a_2 of the third active layer 550_2, and the eighth contact hole CT8 may be formed to expose the fourth conducting region 550b_2 of the third active layer 550_2.

The third conductive layer may include a third source electrode 530_2 and a third drain electrode 540_2. The third source electrode 530_2 is in contact with the third conducting region 550a_2 formed at one side of the third active layer 550_2 through the seventh contact hole CT7. The third drain electrode 540_2 is in contact with the fourth conducting region 550b_2 formed at the other side of the third active layer 550_2 through the eighth contact hole CT8.

The first protective layer 170 is located on the third source electrode 530_2 and the third drain electrode 540_2. The first planarization layer 180 for planarizing a step caused by a thin film transistor such as the second switching transistor GPT_2 180 may be formed on the first protective layer 170.

The pull-up transistor TU and pull-down transistor TD of the scan driver SDR, and the plurality of transistors of a node controller NC may be formed to have the same structure as the pull-up transistor TU described above with reference to FIG. 27. Further, the first distribution transistors MT1 and the second distribution transistors MT2 of the data voltage distribution circuit DMUX may also be formed to have the same structure as the pull-up transistor TU described above with reference to FIG. 27. Some detailed description thereof may be omitted.

Referring to FIG. 28, in the second switching transistor GPT_3 according to some example embodiments, the third active layer 550_3 includes polycrystalline silicon. The embodiment of FIG. 28 is different from the embodiment of FIG. 27 in that the third active layer 550_3 includes polycrystalline silicon. Hereinafter, some redundant description may be omitted, and differences will be mainly described.

In the second switching transistor GPT_3 of FIG. 28, the third active layer 550_3 contains polycrystalline silicon, and includes a first high-concentration doping region 550a_3, a second high-concentration doping region 550b_3, a channel region 550c_3, a first low-concentration doping region 550d_3, and a second low-concentration doping region 550e_3. The channel region 550c_3 may be made of polycrystalline silicon not doped with impurities, the first high-concentration doping region 550a_3 and the second high-concentration doping region 550b_3 may be made of polycrystalline silicon doped with high-concentration impurities, and the first low-concentration doping region 550d_3 and the second low-concentration doping region 550e_3 may be made of polycrystalline silicon doped with low-concentration impurities.

The seventh contact hole CT7 of the first interlayer insulating layer 160 may be formed to expose the first high-concentration doping region 550a_3 of the third active layer 550_2, and the eighth contact hole CT8 thereof may be formed to expose the second high-concentration doping region 550b_3 of the third active layer 550_2. The third source electrode 530_3 is in contact with the first high-concentration doping region 550a_3 formed at one side of the third active layer 550_3 through the seventh contact hole CT7. The third drain electrode 540_3 is in contact with the second high-concentration doping region 550b_3 formed at the other side of the third active layer 550_3 through the eighth contact hole CTB.

When the third active layer 550_3 of the second switching transistor GPT_3 includes polycrystalline silicon, the third active layer 550_3 may have high mobility, so that characteristics of the second switching transistor GPT_3 may be improved. Further, even when the third active layer 550_3 has the narrow channel region 550c_3, the third active layer 550_3 may have excellent mobility, so that the area of the non-display area NDA of the display device 1 may be minimized or reduced.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present invention.

In concluding the detailed description, those skilled in the art will appreciate that many variations and modifications can be made to the example embodiments without substantially departing from the principles of the present invention as defined by the following claims and their equivalents. Therefore, the disclosed example embodiments of the invention are used in a generic and descriptive sense only and not for purposes of limitation.

What is claimed is:

1. A display device, comprising:
 a pixel connected to a scan line and a data line crossing the scan line,
 wherein the pixel includes a light emitting element, a driving transistor configured to control a driving current supplied to the light emitting element according to a data voltage received from the data line, and a first switching transistor configured to apply the data voltage of the data line to the driving transistor according to a scan signal applied to the scan line;
 wherein the driving transistor includes a first active layer including a first oxide semiconductor and a first oxide layer on the first active layer and including a second oxide semiconductor; and wherein the first switching transistor includes a second active layer on the first active layer and including a same oxide semiconductor as the first oxide layer, wherein the driving transistor includes a first gate insulating layer on the first active layer and a first gate electrode on the first gate insulating layer and overlapping the first active layer, and wherein the first oxide layer is between the first gate electrode and the first gate insulating layer.

2. The display device of claim 1, wherein the first oxide semiconductor of the first active layer includes at least one of indium (In), gallium (Ga), zinc (Zn), tin (Sn), or hafnium (Hf).

3. The display device of claim 2, wherein the first and second oxide semiconductors of each of the first oxide layer and the second active layer includes at least one of indium (In), gallium (Ga), zinc (Zn), tin (Sn), or hafnium (Hf).

4. The display device of claim 1, wherein the first active layer includes a first conducting region, a second conducting region, and a channel region between the first conducting region and the second conducting region, and at least a portion of the first oxide layer overlaps the channel region of the first active layer.

5. The display device of claim 4, wherein the driving transistor includes a first source electrode contacting the first conducting region through a first contact hole penetrating an interlayer insulating layer on the first active layer, and a first drain electrode contacting the second conducting region through a second contact hole penetrating the interlayer insulating layer.

6. The display device of claim 1, wherein the second active layer is on the first gate insulating layer, the first switching transistor includes a second gate electrode under the second active layer, and a width of the second active layer is greater than a width of the second gate electrode.

7. The display device of claim 6, wherein the first switching transistor includes a second source electrode contacting one side of the second active layer and a second drain electrode contacting the other side of the second active layer.

8. The display device of claim 7, wherein the first switching transistor includes a first conductive pattern contacting the second source electrode through a fourth hole penetrating an interlayer insulating layer on the second active layer, and a second conductive pattern contacting the second drain electrode through a fifth contact hole penetrating the interlayer insulating layer.

9. The display device of claim 1, further comprising:

a scan driver configured to output a scan signal to the scan line, wherein the scan driver includes a second switching transistor including a third active layer containing a third oxide semiconductor and a third gate electrode under the third active layer.

10. The display device of claim 9, wherein the scan driver includes a third switching transistor including a fourth active layer containing a fourth oxide semiconductor and a fourth gate electrode under the fourth active layer.

11. A display device, comprising:

a substrate including a display area and a non-display area;

a first conductive layer on the substrate and including a light blocking layer in the display area;

a buffer layer on the first conductive layer and covering the light blocking layer;

a first semiconductor layer on the buffer layer and including a first oxide semiconductor, the first semiconductor layer including an active layer in the display area;

a gate insulating layer on the first semiconductor layer and covering the active layer;

a second semiconductor layer on the gate insulating layer and including a second oxide semiconductor, the second semiconductor layer including an oxide layer in the display area;

a second conductive layer on the second semiconductor layer and including a gate electrode;

an interlayer insulating layer on the second conductive layer and covering the gate electrode; and a third conductive layer on the interlayer insulating layer and including a source electrode and a drain electrode, wherein the gate insulating layer is between the first semiconductor layer and the second semiconductor layer.

12. The display device of claim 11, wherein each of the first semiconductor layer and the second semiconductor layer includes at least one of indium (In), gallium (Ga), zinc (Zn), tin (Sn), or hafnium (Hf).

13. The display device of claim 11, wherein the first semiconductor layer includes a first active layer on the light blocking layer, the second conductive layer includes a first gate electrode on the first active layer, and the oxide layer includes a first oxide layer between the first active layer and the first gate electrode.

14. The display device of claim 13, wherein the third conductive layer includes a first source electrode contacting one side of the first active layer through a first contact hole penetrating the interlayer insulating layer to exposed one side of the first active layer, and a first drain electrode contacting the other side of the first active layer through a second contact hole penetrating the interlayer insulating layer to exposed the other side of the first active layer.

15. The display device of claim 14, wherein the first source electrode is in contact with the light blocking layer through a third contact hole penetrating the interlayer insulating layer and the buffer layer to expose a portion of the light blocking layer.

16. The display device of claim 13, wherein the first conductive layer further includes a second gate electrode, and the second semiconductor layer further includes a second active layer on the second gate electrode.

17. The display device of claim 16, wherein the second conductive layer further includes a second source electrode contacting one side of the second active layer and a second drain electrode contacting the other side of the second active layer.

18. The display device of claim 17, wherein the third conductive layer further includes a first conductive pattern contacting the second source electrode through a fourth contact hole penetrating the interlayer insulating layer to expose a portion of the second source electrode, and a second conductive pattern contacting the second drain electrode through a fifth contact hole penetrating the interlayer insulating layer to expose a portion of the second drain electrode.

19. The display device of claim 11,
wherein the first conductive layer further includes a third gate electrode in the non-display area, the second semiconductor layer further includes a third active layer on the third gate electrode, and the second conductive layer further includes a third source electrode contacting one side of the third active layer and a third drain electrode contacting the other side of the third active layer.

\* \* \* \* \*